US012627312B1

(12) United States Patent
Zalucki et al.

(10) Patent No.: US 12,627,312 B1
(45) Date of Patent: May 12, 2026

(54) MULTI-Nyquist CORRELATOR FOR FREQUENCY MEASUREMENT

(71) Applicant: BAE SYSTEMS Information and Electronic Systems Integration Inc., Nashua, NH (US)

(72) Inventors: Michael A. Zalucki, Hollis, NH (US); Daniel Wasson, Billerica, MA (US); Anthony J. Crawford, Milford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 178 days.

(21) Appl. No.: 18/434,247

(22) Filed: Feb. 6, 2024

(51) Int. Cl.
*H03M 1/12* (2006.01)
*H03M 1/18* (2006.01)

(52) U.S. Cl.
CPC ........... *H03M 1/126* (2013.01); *H03M 1/181* (2013.01)

(58) Field of Classification Search
CPC .. H03M 1/121; H03M 1/1215; H03M 1/1245; H03M 1/0626; H03M 1/126; H03M 1/12; H03M 1/0629; H03M 1/1285; H03M 1/0631; H03M 1/0639; H03M 3/458; H03M 1/0624; H03M 1/0836; H03M 1/1009; H03M 7/3062; H03M 1/04; H03M 1/0604; H03M 1/0607; H03M 1/0609; H03M 1/0617; H03M 1/0634; H03M 1/0658; H03M 1/08; H03M 1/1023; H03M 1/1042;

(Continued)

(56) References Cited

U.S. PATENT DOCUMENTS 6,005,506 A   12/1999   Bazarjani et al.
6,031,879 A   * 2/2000   Pace ....................... H04L 27/00
                           375/325

(Continued)

FOREIGN PATENT DOCUMENTS

WO     2007044749 A2    4/2007

OTHER PUBLICATIONS

Li, Hsueh-Jyh and Kiang, Yean-Woei, "Radar and Inverse Scattering," The Electrical Engineering Handbook (2005) retreived from the internet at: URL:https://www.sciencedirect.com/science/article/pii/B9780121709600500475. 2 pages.

*Primary Examiner* — Linh V Nguyen
(74) *Attorney, Agent, or Firm* — Gary McFaline

(57) ABSTRACT

A multi-Nyquist correlator. An example system includes a first analog to digital converter (ADC) configured to operate at a first sampling frequency and a second ADC configured to operate at a second sampling frequency different from the first sampling frequency. Each of first and second ADCs may receive a plurality of radio frequency (RF) pulses, and respectively generate first and second ADC outputs. First and second digital receivers of the system respectively process the first and second ADC outputs and respectively generate first and second pluralities of pulse description data signals (PDDs). A correlator of the system corelates PDDs of the first and second pluralities of PDDs, to determine which RF pulses received are related to each other. With this relationship determined, the true Nyquist zone can be determined, and the true RF frequency can be calculated. A frequency measurement module may be used to measure frequency of received signal.

15 Claims, 6 Drawing Sheets

(58) Field of Classification Search
CPC .. H03M 1/1052; H03M 1/1085; H03M 1/123;
H03M 1/128; H03M 1/60; H03M 1/66;
H03M 1/662; H04B 7/0617; H04B
1/0025; H04B 1/16; H04B 1/0039; H04B
1/0042; H04B 1/0046; H04B 1/40; H04B
1/44; H04B 7/08; H04B 7/12; H04B
7/1851; H04B 7/18515; H04B 7/212;
H04B 1/00; H04B 1/0007; H04B 1/0014;
H04B 1/005; H04B 1/0053; H04B
1/0057; H04B 1/1638; H04B 1/18; H04B
1/406; H04B 1/70712; H04B 1/7163;
H04B 1/71637; H04B 10/00; H04B
10/503; H04B 10/541; H04B 10/6933;
H04B 10/697; H04B 10/6971; H04B
2210/006; H04B 7/02; H04B 7/0848;
H04B 7/18513; H04L 27/2651; H04L
27/0002; H04L 27/265; H04L
2025/03445; H04L 25/024; H04L
25/03006; H04L 25/03038; H04L
25/03057; H04L 25/03133; H04L
25/03159; H04L 25/03203; H04L 27/00;
H04L 27/0006; H04L 27/2666; H04L
5/06; H04L 7/0054; H04L 7/0062; H04L
7/0337
USPC .......................... 341/118, 120, 141, 155, 159
See application file for complete search history.

(56)                References Cited

U.S. PATENT DOCUMENTS

| 6,731,911 | B1 * | 5/2004 | Hirata | ........................ | H03J 7/04 |
| | | | | | 455/75 |
| 7,245,638 | B2 * | 7/2007 | Agazzi | .............. | H04L 25/03006 |
| | | | | | 375/327 |
| 7,365,527 | B2 * | 4/2008 | Sullivan | ................. | G01R 23/14 |
| | | | | | 324/76.24 |
| 7,436,910 | B2 | 10/2008 | Fudge et al. | | |
| 7,436,912 | B2 | 10/2008 | Fudge et al. | | |
| 7,489,745 | B2 | 2/2009 | Fudge | | |
| 8,064,560 | B2 | 11/2011 | Hunter et al. | | |
| 8,243,579 | B2 * | 8/2012 | Lee | ...................... | H04L 27/2647 |
| | | | | | 375/349 |
| 8,310,387 | B2 | 11/2012 | Harris et al. | | |
| 8,340,218 | B2 | 12/2012 | Drennen, III | | |
| 8,401,050 | B1 | 3/2013 | Fudge et al. | | |
| 8,509,354 | B2 | 8/2013 | Fudge et al. | | |
| 8,823,573 | B1 * | 9/2014 | Nguyen | ................. | H03M 1/12 |
| | | | | | 341/155 |
| 8,890,589 | B2 * | 11/2014 | Kim | .................... | H03M 1/1245 |
| | | | | | 327/158 |
| 9,544,167 | B2 * | 1/2017 | Katabi | ................ | H04L 27/2666 |
| 9,864,045 | B2 | 1/2018 | Fairley | | |
| 10,110,409 | B1 | 10/2018 | Kappes et al. | | |
| 10,348,347 | B2 | 7/2019 | Crawford et al. | | |
| 10,931,294 | B2 | 2/2021 | Kim et al. | | |
| 2006/0182209 | A1 | 8/2006 | Coyne et al. | | |
| 2014/0002284 | A1 * | 1/2014 | Tan | ...................... | H03M 1/1052 |
| | | | | | 341/118 |
| 2018/0102926 | A1 * | 4/2018 | Marr | ......................... | H04L 5/06 |
| 2020/0220613 | A1 * | 7/2020 | Rutt | ......................... | H04B 1/44 |
| 2021/0013897 | A1 * | 1/2021 | Kim | ..................... | G01R 23/145 |
| 2023/0336194 | A1 | 10/2023 | Cantrell et al. | | |
| 2024/0295593 | A1 * | 9/2024 | Akiyama | .............. | H03M 1/121 |

* cited by examiner

Signals 102p, 102q, 102r, ..., 102t

100

ADC 104a ← Clock 105a (Fsa)

ADC 104b ← Clock 105b (Fsb)

ADC 104c ← Clock 105c (Fsc)

· · ·

ADC 104N ← Clock 105N (FsN)

ADC output 105a

ADC output 105b

ADC output 105c

ADC output 105N

Digital Receiver 108a

Digital Receiver 108b

Digital Receiver 108c

· · ·

Digital Receiver 108N

PDDb0, PDDb1, PDDb2, PDDb3, ...

PDDc0, PDDc1, PDDc2, PDDc3, ...

PDDa0, PDDa1, PDDa2, PDDa3, ...

PDDN0, PDDN1, PDDN2, PDDN3, ...

Correlator 120

Frequency measurement module 234

Measured frequency Fp of the RF signal 102p, measured frequency Fq of the RF signal 102q, and so on

FIG. 1

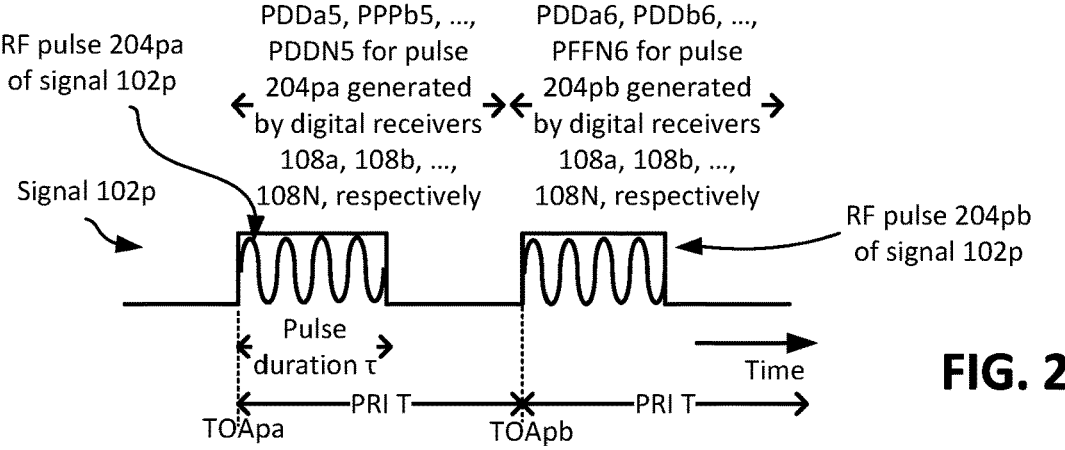

RF pulse 204pa of signal 102p

Signal 102p

PDDa5, PPPb5, ..., PDDN5 for pulse 204pa generated by digital receivers 108a, 108b, ..., 108N, respectively PDDa6, PDDb6, ..., PFFN6 for pulse 204pb generated by digital receivers 108a, 108b, ..., 108N, respectively RF pulse 204pb of signal 102p Pulse duration τ

Time

PRI T

PRI T

TOApa

TOApb

FIG. 2

Sampling frequency Fsa of ADC 104a is 1000 Hz

Sampling frequency Fsc of ADC 104c is 1010 Hz

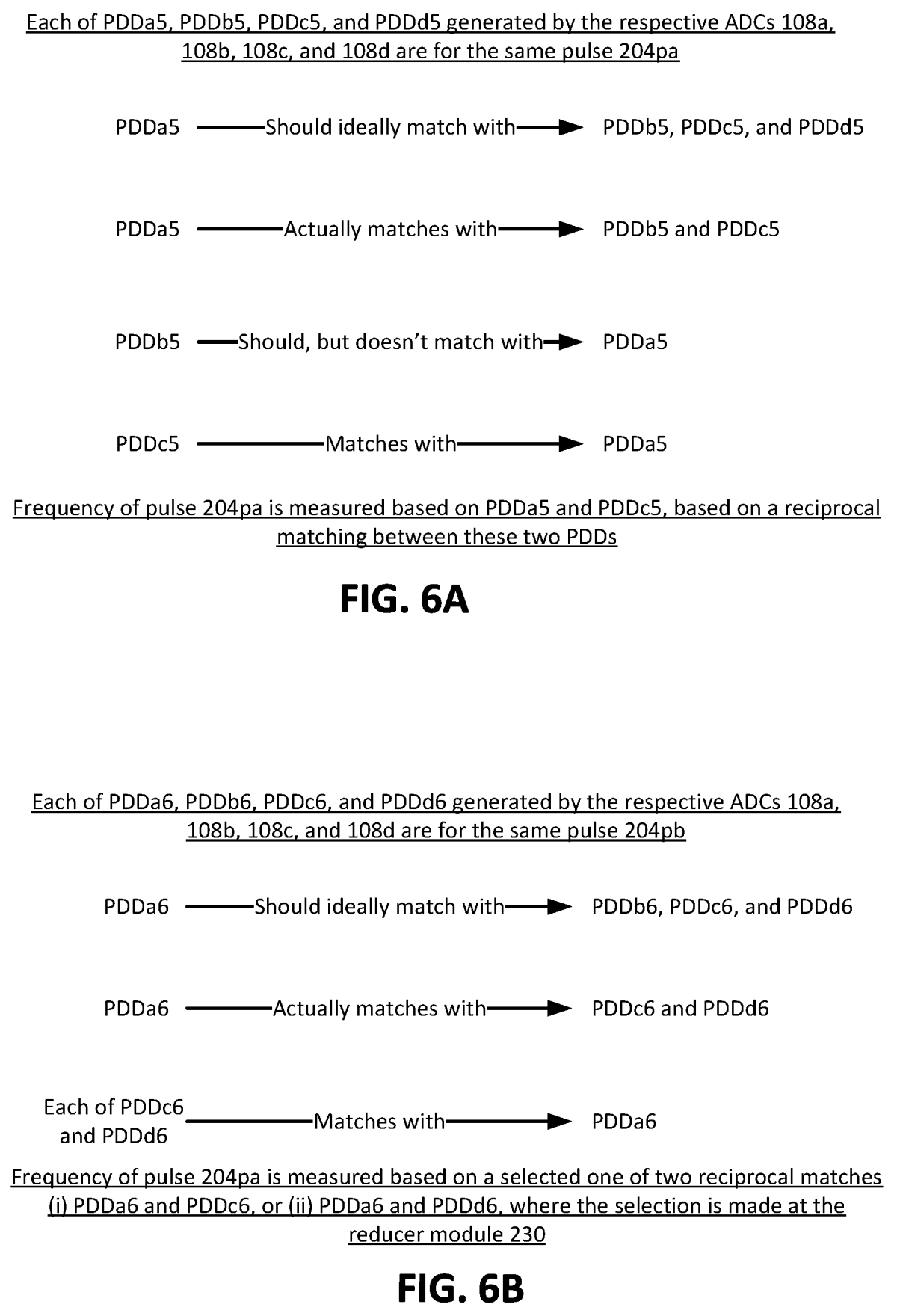

Each of PDDa5, PDDb5, PDDc5, and PDDd5 generated by the respective ADCs 108a, 108b, 108c, and 108d are for the same pulse 204pa PDDa5 ———Should ideally match with——▶ PDDb5, PDDc5, and PDDd5

PDDa5 ————Actually matches with——▶ PDDb5 and PDDc5

PDDb5 ——Should, but doesn't match with—▶ PDDa5

PDDc5 —————Matches with————▶ PDDa5

Frequency of pulse 204pa is measured based on PDDa5 and PDDc5, based on a reciprocal matching between these two PDDs

FIG. 6A

Each of PDDa6, PDDb6, PDDc6, and PDDd6 generated by the respective ADCs 108a, 108b, 108c, and 108d are for the same pulse 204pb PDDa6 ———Should ideally match with——▶ PDDb6, PDDc6, and PDDd6

PDDa6 ————Actually matches with——▶ PDDc6 and PDDd6

Each of PDDc6 and PDDd6 ————Matches with————▶ PDDa6

Frequency of pulse 204pa is measured based on a selected one of two reciprocal matches (i) PDDa6 and PDDc6, or (ii) PDDa6 and PDDd6, where the selection is made at the reducer module 230

FIG. 6B

MULTI-Nyquist CORRELATOR FOR FREQUENCY MEASUREMENT

FIELD OF DISCLOSURE

The present disclosure relates to signals, and more particularly, to a multi-Nyquist correlator that can be used for detection and measurement of frequency of signals.

BACKGROUND

Radio frequency (RF) signals are used in many different applications. In some example applications, such as a pulsed radar system, pulsed RF signals are used. A scanner monitoring the RF environment can detect such RF signals. The Nyquist sampling criteria generally states that the sampling rate of a given RF signal must be at least twice the rate of that signal's highest frequency component. To this end, there remain a number of nontrivial issues with detecting RF signals, given the Nyquist sampling constraint.

BRIEF DESCRIPTION OF THE DRAWINGS

FIG. 1 schematically illustrates a system comprising (i) a plurality of analog to digital converters (ADCs), wherein each ADC receives a plurality of RF signals, (ii) a corresponding plurality of digital receivers, (iii) a correlator, and (iv) a frequency measurement module, wherein the frequency measurement module is configured to measure a frequency of one or more RF signals received by the plurality of ADCs, in accordance with an embodiment of the present disclosure.

FIG. 2 illustrates an example pulsed RF signal that might be received by the system of FIG. 1, in accordance with an embodiment of the present disclosure.

FIGS. 6A and 6B each illustrates an example matching scenario between various PDD signals within the correlator of the system of FIGS. 1 and 3, in accordance with an embodiment of the present disclosure.

Figure 3:
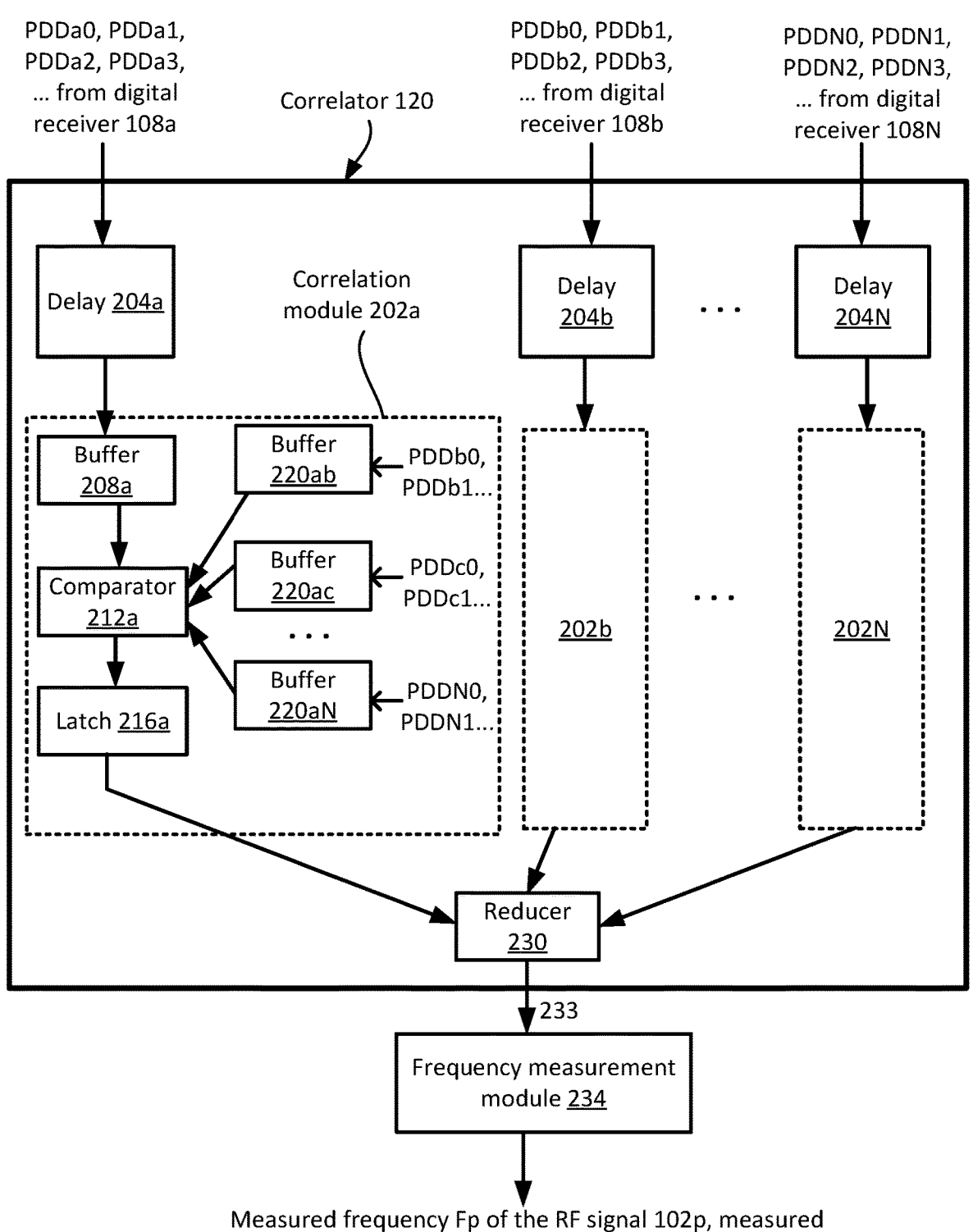
FIG. 3 illustrates the correlator of the system of FIG. 1, wherein the correlator is configured to correlate two different pulse descriptor data (PDD) signals, to facilitate measurement of a frequency of an RF pulse of an RF signal received by the system of FIG. 1, in accordance with an embodiment of the present disclosure.

Although the following detailed description will proceed with reference being made to illustrative examples, many alternatives, modifications, and variations thereof will be apparent in light of this disclosure.

DETAILED DESCRIPTION

A multi-Nyquist correlator is disclosed that can be used for frequency measurement of signals. An example system includes a first analog to digital converter (ADC) configured to operate at a first sampling frequency and a second ADC configured to operate at a second sampling frequency different from the first sampling frequency. Each of the first and second ADCs may receive a plurality of radio frequency (RF) pulses, and generate a first ADC output and a second ADC output, respectively. The system further includes a first digital receiver to process the first ADC output and generate a first plurality of pulse description data signals (PDDs), and a second digital receiver to process the second ADC output and generate a second plurality of PDDs. Each PDD of the first and second plurality of PDDs is indicative of attributes of a corresponding RF pulse of the plurality of RF pulses. The system further includes a correlator configured to correlate a first PDD of the first plurality of PDDs with a second PDD of the second plurality of PDDs, wherein each of the first PDD and the second PDD includes attributes of a same RF pulse of the plurality of RF pulses. Examples of attributes included in a PDD associated with a RF pulse comprise an observed frequency of the RF pulse, a time of arrival of the RF pulse, and/or a measured amplitude of the RF pulse. In this manner, the correlator can determine which pulses received, by each receiver, are related to each other. Once this relationship is determined, the true Nyquist zone is determined, and the true RF frequency can be calculated. Thus, in some such examples, the system may further include a frequency measurement module configured to measure a frequency of the RF pulse, based at least in part on the first and second PDDs, and the first and second sampling frequencies.

General Overview

As mentioned herein above, there remain a number of nontrivial issues with detecting an RF signal, given the constraints of Nyquist criteria. In a given application, an RF signal of interest may be comingled with one or more other RF signals, and an antenna of the system detects a combination of the RF signals. Sampling such a combination of RF signals with an analog to digital converter (ADC) having sufficiently high sampling rate and processing the sampled output (e.g., using a digital receiver) may facilitate identification of the RF signal of interest. However, the sampling frequency of the ADC has to be high enough, such that the frequency of the RF signal of interest is within a first Nyquist zone of the sampling frequency of the ADC. Achieving such a high sampling rate necessitates high power, circuit complexity, and costly ADCs and digital receivers.

Accordingly, techniques are described herein to use a plurality of ADCs to sample a combination of a plurality of RF signals including an RF signal of interest, and measure a frequency of the RF signal of interest, where a sampling frequency of each ADC is relatively lower than a frequency of the RF signal of interest. For example, the RF signal may be within a second Nyquist zone, a third Nyquist zone, or a higher numbered Nyquist zone of a sampling frequency of individual ADCs. Using the relatively low sampling rate ADCs and corresponding digital receivers may result in relatively lower power consumption, as well as a relatively less complex and less costly system.

For example, in a multi-Nyquist receiver application, digital receivers can be used that produce multiple pulse descriptor data signals (referred to herein as PDD signals, or more simply, PDDs). A given PDD includes receiver data that can be cross-compared to other digital receivers of the system. All of such pulse descriptor data may be synchronous to a common system clock. Due to the Nyquist theorem, when under sampling, an alias frequency is received in the range of the determined sampling frequency divided by two. Individual receiver comparison measurements can be done to resolve the actual frequencies and signals. Due to the fact that RF pulses can be received from many different sources at the same time, there is a need to determine which pulses received, by each receiver, are related to each other. Once this relationship is determined, the true Nyquist zone can be determined, and the true RF frequency can be calculated.

In one example embodiment, each of a plurality of ADCs sampling a plurality of RF signals has a different respective sampling rate (e.g., a first ADC has a first sampling frequency that is different from a second sampling frequency of a second ADC). Each ADC provides the corresponding sampled ADC output to a corresponding digital receiver. Each digital receiver applies fast Fourier transform (FFT) and/or other techniques, to detect a frequency of the RF signal of interest and/or one or more other RF signals of the plurality of RF signals. However, because the ADCs sample the RF signals at a lower rate than the actual frequency of the RF signal of interest, the frequency detected by a digital receiver may be an alias frequency (also referred to herein as an observed frequency) of the RF signal, where the observed frequency may be different from the actual frequency of the RF signal. For example, the observed frequency is within a first Nyquist zone of the sampling frequency of the ADC, where the first Nyquist zone ranges from 0 to Fs/2, where Fs is the sampling frequency of the ADC. On the other hand, the actual frequency of the RF signal may be within a second Nyquist zone, or a third Nyquist zone, or a higher numbered Nyquist zone of the sampling frequency of the ADC. Moreover, by analyzing an output of an ADC, it may not be possible to detect the Nyquist zone that includes the actual frequency of the RF signal. Accordingly, information from the plurality of ADCs, each with different sampling frequencies, may be analyzed, to detect a Nyquist zone number of a sampling frequency of an ADC that includes the actual frequency of the RF signal. Once the Nyquist zone is detected, the frequency of the RF signal may be determined based on the detected Nyquist zone number of the sampling frequency of the ADC, and observed frequency of the RF signal at the corresponding digital receiver. Each digital receiver generates a plurality of pulse descriptor data signals (PDDs), where each PDD includes indication of one or more attributes of a corresponding RF pulse of an RF signal as sampled by the corresponding ADC and as measured by the corresponding digital receiver. Examples of the attributes include an observed frequency of the corresponding RF pulse at the digital receiver, a measured amplitude of the corresponding RF pulse, and a time of arrival (TOA) of the corresponding RF pulse at the corresponding ADC. A correlator correlates two PDDs that it deems to be associated with the same RF pulse. For example, the correlator compares PDDs from multiple digital receivers, to correlate a first PDD generated by a first digital receiver with a second PDD generated by another (such as a second) digital receiver, where the first and second PDDs are deemed to include attributes of the same RF pulse. In an example, the correlator compares one or more attributes (such as observed frequency, measured amplitude, and/or TOA) of the PDDs, to determine the PDDs are related to the same RF signal and thus correlate the two PDDs. Note that the first PDD is generated by the first digital receiver, based on a first ADC sampling the combination of RF signals; and the second PDD is generated by the second digital receiver, based on a second ADC sampling the combination of RF signals. Because the sampling frequencies of the first and second ADCs are different, the observed frequencies of the same RF signal, as indicated by the first PDD and the second PDD, are also different. In an example, a frequency measurement module measures the actual frequency of the RF signal, based on the observed frequencies indicated by the two correlated PDDs, the first sampling frequency, and the second sampling frequency, e.g., as described below with respect to equations 1-3. Numerous configurations and variations will be apparent in light of this disclosure.

Architecture

FIG. 1 schematically illustrates a system 100 comprising (i) a plurality of analog to digital converters (ADCs) 104a, 104b, 104c, . . . , 104N, wherein each ADC 104 receives a plurality of RF signals 102p, 102q, 102r, . . . , 102t, (ii) a corresponding plurality of digital receivers 108a, 108b, 108c, . . . , 108N, (iii) a correlator 120, and (iv) a frequency measurement module 234, wherein the frequency measurement module 234 is configured to measure a frequency of one or more RF signals 102p, . . . , 102t received by the plurality of ADCs 104a, 104b, 104c, . . . , 104N, in accordance with an embodiment of the present disclosure.

The signals 102p, . . . , 102t are analog signals, and are referred generally as signals 102 in plural, and signal 102 in singular. The signals 102 are radio frequency (RF) signals in an example, e.g., has frequencies of at least 20 KHz or more. In an example, the signals 102 have frequencies in the megahertz range, or in the gigahertz range. In another example, one or more of the signals 102 may have any appropriate frequencies, such as a signal having a frequency that is less than a frequency of an RF signal. In any case, the frequencies of the signals 102 are not known to the system 100, and the system 100 aims to measure the frequencies of one or more of the signals 102. The signals 102 may be received at one or more receive antennas, and/or may be sourced from another appropriate signal source.

In some sections of the below description, techniques associated with measuring a frequency of a specific signal 102p is described. Such techniques may also be applied to measure frequencies of one or more of the remaining signals 102q, 102r, . . . , 102t.

FIG. 2 illustrates an example waveform of an example signal 102p received by each of the ADCs 104a, . . . , 104N of FIG. 1, in accordance with an embodiment of the present disclosure. In an example, the signal 102p is a pulsed analog signal. The waveform of a pulsed signal may be represented by a pulse duration r, and a pulse repetition interval (PRI) T. As illustrated in FIG. 2, PRI T is the time interval between two adjacent pulses. In an example, such a pulsed signal may be emitted by a pulsed radar system, and/or by another appropriate RF signal emitting system. The example RF signal 102p illustrated in FIG. 2 has two distinct RF pulses 204pa and 204pb, although the RF signal 102p may have any other number of such pulses. An RF pulse (such as the pulse 204pa) refereed herein is an analog RF signal of a short duration, such as a burst of an RF signal.

Although FIG. 2 illustrates repeating RF pulses of an RF signal 102p, another RF signal (such as signal 1002q) may be a short duration, non-repeating RF signal (e.g., having a single RF pulse). In yet another example, another RF signal (such as signal 1002r) may be a continuous RF signal (e.g., having signal duration over a longer period of time, instead of having a pulsed signal duration). Any other type of RF signals input to the system 100 may also be possible. As will be described below, for each RF pulse, each digital receiver 108 generates a corresponding PDD.

Referring again to FIG. 1, the system 100 includes N number of ADCs 104a, . . . , 104N, where N is a positive integer that is at least two. For example, the system 100 includes two or more ADCs. In another example, three or more ADCs may provide more reliable frequency measurement, and hence, N is a positive integer that is at least three. Increasing the number of ADCs results in higher reliability of the measurement of the frequency of the signals 102, albeit at higher circuit complexity, area, and cost. In an example, the ADCs 104 are synchronous to a common system clock.

Each ADC 104 receives a corresponding sampling clock 105, and samples the received signals 102 at the rate of the sampling clock 105, to generate a corresponding digital ADC output 105. A combination of the signals 102p, . . . , 102t are received at individual ADCs 104, where each ADC samples the combination of the signals 102p, . . . , 102t at respective sampling frequency.

For example, the ADC 104a receives a sampling clock 105a having a sampling frequency Fsa, and samples the combination of the signals 102p, . . . , 102t to generate an ADC output 105a comprising digital samples. Similarly, the ADC 104b receives a sampling clock 105b having a sampling frequency Fsb, and samples the combination of the signals 102p, . . . , 102t to generate an ADC output 105b comprising digital samples. Similarly, the ADC 104N receives a sampling clock 105N having a sampling frequency FsN, and samples the combination of the signals 102p, . . . 102t to generate an ADC output 105N comprising digital samples.

In an example, the sampling frequencies Fsa, Fsb, Fsc, . . . , FsN of the ADCs 104a, . . . , 104N, respectively, are different from each other. For example, if the difference between the sampling frequencies Fsa, Fsb, Fsc, . . . , FsN are reduced below a threshold value (e.g., the sampling frequencies Fsa, Fsb, Fsc, . . . , FsN are close to each other), this adversely affects the frequency measurement accuracy. On the other hand, increasing the differences between the sampling frequencies Fsa, Fsb, Fsc, . . . , FsN results in the frequencies adequately covering relatively lower number of Nyquist zones, which in turn results in reducing a range of frequencies of the signals 102 that can be detected by the system 100. The differences between the various sampling frequencies Fsa, Fsb, Fsc, . . . , FsN may vary from one example to the next. Merely as an example, when a signal 102p is expected to be about 1 GHz or more, the sampling frequency Fsa may be chosen to be 400 MHz and the sampling frequency Fsb may be chosen to be 410 MHz, although other sampling frequencies may also be possible.

The system 100 comprises a plurality of digital receivers 108a, 108b, 108c, . . . , 108N corresponding to the plurality of ADCs 104a, 104b, 104c, . . . , 104N. For example, digital receiver 108a receives ADC output 105a from the ADC 104a, digital receiver 108b receives ADC output 105b from the ADC 104b, and so on, and digital receiver 108N receives ADC output 105N from the ADC 104N.

As described above, each of the ADC outputs 105a, . . . , 105N is a corresponding digital sample of a combination of the signals 102a, . . . , 102t. In an example, each digital receiver 108 processes the corresponding ADC output 105, to measure a frequency and/an amplitude of each of the signals 102a, 102b, . . . , 102N, e.g., based on fast Fourier transformation (FFT) of the corresponding ADC outputs. However, note that the sampling rates of the ADCs 104 are less than frequencies of one or more of the signals 102p, . . . , 102t. For analog to digital conversion, the Nyquist-Shannon sampling theorem states that the sampling rate of an ADC 104 has to be at least twice the maximum bandwidth of the combination of signals 102, in order to allow the signals 102 to be reproduced from the digital samples generated by the ADCs 104. However, if the sampling rate of an ADC 104 is significantly less than a frequency of a specific one of the signals 102 (e.g., if the sampling rate of an ADC is less than half of the frequency of the specific one of the signals 102), the frequency of that specific signal 102 observed by a corresponding digital receiver 108 may not match with the actual frequency of the specific signal 102. The observed frequency is an alias frequency due to under-sampling of the specific signal 102. For example, the observed frequency of a signal 102 (e.g., as observed by a receiver 108) and the actual frequency of a signal 102 may be within two different Nyquist zones of the sampling frequency of the corresponding ADC 104.

Merely as an example, applying Nyquist theorem, if the frequency of the signal 102p is 2.2 GHz and the sampling frequency of the ADC 104a is 1 GHz, the observed frequency of the signal 102p at the digital receiver 108a may be 200 MHz. Similarly, if the frequency of the signal 102p is 2.2 GHz and the sampling frequency of the ADC 104a is 1.01 GHz, the observed frequency of the signal 102p at the digital receiver 108a may be 180 MHz. Similarly, if the frequency of the signal 102p is 2.3 GHz and the sampling frequency of the ADC 104a is 1 GHz, the observed frequency of the signal 102p at the digital receiver 108a may be 300 MHz. Similarly, if the frequency of the signal 102p is 4.2 GHz and the sampling frequency of the ADC 104a is 1 GHz, the observed frequency of the signal 102p at the digital receiver 108a may be 200 MHz.

So, the observed frequency of a signal 102p at a digital receiver 108a is based on the actual frequency of the signal 102p, as well as a sampling rate of the ADC 104a. In an example, knowing sampling frequencies of two or more ADCs, and observed frequencies of the signal 102p from two or more digital receivers 108 facilitate in measuring an actual frequency of the signal 102p, as will be described below.

In an example, for a given ADC 104 and a corresponding digital receiver 108, a corresponding plurality of Nyquist zones subdivide a spectrum of a signal 102 (such as a signal 102p) into regions spaced uniformly at intervals of Fs/2, where Fs is a sampling frequency of the ADC 104. Nyquist zones are described below in further detail with respect to FIGS. 5A and 5B.

Each Nyquist zone contains a copy of the spectrum of the signal 102p or a mirror image of it. The first Nyquist zone is defined as a signal between 0 and Fs/2, and the second Nyquist zone is defined as a signal between Fs/2 and Fs. For example, for a 400 MHz sampling rate of an ADC, the corresponding Nyquist zone 0 is 0 to 200 MHz, the Nyquist zone 1 is 200 to 400 MHz, the Nyquist zone 2 is 400 to 600 MHz, and so on. In an example, knowing sampling frequencies of two or more ADCs, and observed frequencies of the signal 102p at two or more digital receivers facilitate in (i) determining a true Nyquist zone of the signal 102p, and/or (ii) measuring the actual frequency of the signal 102p, as will be described below.

In one embodiment, each digital receiver 108 receives the corresponding ADC output 105, and generates a corresponding plurality of pulse descriptor data (PDD), also referred to herein as descriptor data. For example, the digital receiver 108a receives the ADC output 105a and generates PDDa0, PDDa1, PDDa2, PDDa3, and so on. Similarly, the digital receiver 108b receives the ADC output 105b and generates PDDb0, PDDb1, PDDb2, PDDb3, and so on. Similarly, other digital receivers 108*c*, . . . , 108N also generate corresponding PDDs, as illustrate in FIG. 1.

Each PDD includes one or more corresponding attributes of a corresponding RF pulse. For example, referring to FIG. 2, the signal 102*p* has two different RF pulses 204*pa* and 204*pb*, and accordingly, each digital receiver 108 generates two corresponding PDDs for the two RF pulses 204*pa* and 204*pb*. Merely as examples, each of PDDa5, PDDb5, PDDc5, . . . , PDDN5 generated by the digital receivers 108*a*, 108*b*, 108*c*, . . . , 108N, respectively, may correspond to the RF pulse 204*pa* of the RF signal 102*p*; each of PDDa6, PDDb6, PDDc6, . . . , PDDN6 generated by the digital receivers 108*a*, 108*b*, 108*c*, . . . , 108N, respectively, may correspond to the RF pulse 204*pb* of the RF signal 102*p*; and so on. In an example, the PDDs are synchronous to a common system clock.

Note that each ADC has a corresponding sampling rate, and the rate at which an ADC operates is different from a rate at which a different ADC operates. Accordingly, for the same RF pulse 204*pa*, the various digital receivers 108*a*, 108*b*, . . . , 108N may correspondingly generate the PDDa5, PDDb5, . . . , PDDN5, respectively, at different instances of time.

Each PDD includes one or more attributes of the corresponding RF pulse. Thus, continuing with the above example, each of PDDa5, PDDb5, PDDc5, and PDDd5 includes one or more attributes of the corresponding RF pulse 204*pa*; and each of PDDa6, PDDb6, PDDc6, and PDDd6 includes one or more attributes of the corresponding RF pulse 204*pb*.

Note that in some examples, an RF signal may not include pulses, and may be a continuous RF signal without any periodicity or pulse repetition interval (PRI)—in such a case, a digital receiver 1108 will periodically generate a PDD for the RF signal, where each PDD now corresponds to a certain duration of the RF signal.

In one embodiment, attributes included in a PDD includes one or more of an observed frequency of a portion or pulse of the corresponding RF signal, an amplitude of the portion or pulse of the corresponding RF signal, and/or a time of arrival (TOA) of the RF signal at the corresponding ADC.

Note that the attributes included in a PDD includes one or more of an observed frequency of a portion or a pulse of the corresponding RF signal, where the observed frequency is as observed or detected at the corresponding digital receiver. The observed frequency of an RF signal need not match the actual frequency of the signal, due to the relatively low sampling rate of the ADCs relative to the frequency of the RF signals, as described above.

In one embodiment, attributes indicated by a PDD includes a measured amplitude of the corresponding RF signal (such as the corresponding pulse or portion of the RF signal). For example, PDDa5 and PDDa6 generated by the digital receiver 108*a* may correspond to the two RF pulses 204*pa* and 204*pb* of the RF signal 102*p*, respectively—hence, PDDa5 includes a measured amplitude of the RF pulse 204*pa* (e.g., as sampled by the ADC 104*a* and measured by the ADC 104*a* and/or the receiver 108*a*), and PDDa6 includes a measured amplitude of the RF pulse 204*pb*, for example. Similarly, for example, PDDb5 and PDDb6 generated by the digital receiver 108*b* may correspond to the two RF pulses 204*pa* and 204*pb* of the RF signal 102*p*, respectively—hence, PDDb5 includes a measured amplitude of the RF pulse 204*pa*, and PDDb6 includes a measured amplitude of the RF pulse 204*pb*, for example (e.g., as sampled by the ADC 104*b* and measured by the ADC 104*b* and/or the receiver 108*b*).

In one embodiment, attributes indicated by a PDD includes a time of arrival (TOA) of the corresponding pulse or portion of the RF signal at the corresponding ADC. For example, PDDa5 and PDDa6 generated by the digital receiver 108*a* may correspond to the two RF pulses 204*pa* and 204*pb* of the RF signal 102*p*, respectively—hence, PDDa5 includes a TOApa (see FIG. 2) of arrival of a beginning of the pulse 204*pa* at the ADC 104*a*; and PDDa6 includes a TOApb of arrival of a beginning of the pulse 204*pb* at the ADC 104*a*. Similarly, for example, PDDb5 and PDDb6 generated by the digital receiver 108*b* may correspond to the two RF pulses 204*pa* and 204*pb* of the RF signal 102*p*, respectively—hence, PDDb5 includes the TOApa of arrival of the beginning of the pulse 204*pa* at the ADC 104*b*, and PDDb6 includes the TOApb of arrival of the beginning of the pulse 204*pb* at the ADC 104*b*.

Continuing with the above described example where each of the PDDa5, PDDb5, PDDc5, and PDDd5 generated by the respective digital receivers 108*a*, 108*b*, 108*c*, and 108*d* are for the same pulse 204*pa* of the RF signal 102*p*, in an example, the PDDa5, PDDb5, PDDc5, and PDDd5 may indicate substantially the same amplitude (although there may be some relatively small difference in the amplitude due to noise and/or other imperfections in the system 100). For example, because each of PDDa5, PDDb5, PDDc5, and PDDd5 are for the same pulse 204*pa*, each of these PDDs may indicate similar amplitude of the pulse 204*pa*, e.g., the same amplitude within a tolerance level of 1%, or 5%, or 10%, for example. Similarly, continuing further with the above described example where each of the PDDa6, PDDb6, PDDc6, and PDDd6 generated by the respective digital receivers 108*a*, 108*b*, 108*c*, and 108*d* are for the same pulse 204*pb* of the RF signal 102*p*, in an example, these PDDs may include similar amplitude of the pulse 204*pb* (although there may be some difference in the amplitude due to noise and/or other imperfections in the system 100), e.g., the same amplitude within a tolerance level of 1%, or 5%, or 10%, for example.

Similarly, continuing further with the above described example where each of the PDDa5, PDDb5, PDDc5, and PDDd5 generated by the respective digital receivers 108*a*, 108*b*, 108*c*, and 108*d* are for the same pulse 204*pa* of the RF signal 102*p*, in an example, the pulse 204*pa* would arrive at the ADCs 104*a*, 104*b*, 104*c*, 104*d* at substantially the same time (e.g., within a set tolerance of one another, such as within 1% to 5% of one another). Accordingly, the TOA of the pulse 204*pa* at the ADCs 104*a*, 104*b*, 104*c*, 104*d* may be substantially the same, and hence, PDDa5, PDDb5, PDDc5, and PDDd5 may indicate substantially similar TOA (although there may be some difference in the TOA due to noise and/or other imperfections in the system 100).

Similarly, continuing further with the above described example where each of the PDDa6, PDDb6, PDDc6, and PDDd6 generated by the respective digital receivers 108*a*, 108*b*, 108*c*, and 108*d* are for the same pulse 204*pb* of the RF signal 102*p*, in an example, the pulse 204*b* would arrive at the ADCs 104*a*, 104*b*, 104*c*, 104*d* at substantially the same time. Accordingly, the TOA of the pulse 204*b* at the ADCs 104*a*, 104*b*, 104*c*, 104*d* may be substantially the same, and hence, PDDa6, PDDb6, PDDc6, and PDDd6 may indicate substantially similar TOA (although there may be some difference in the TOA due to noise and/or other imperfections in the system 100).

Thus, as described above, PDDs generated by various digital receivers 108*a*, which are for the same RF pulse of an RF signal, may have substantially similar (e.g., within a tolerance level of 1%, or 5%, or 10%, for example) amplitude and/or TOA, although the observed in the frequencies
in the PDDs may be different, e.g., due to difference in the
sampling rates of the PDDs.

The system 100 further includes a correlator 120 which
corelates the PDDs from the various digital receivers 108*a*,
. . . , 108N, to facilitate measurement of the frequency Fp of
the RF signal 102*p*, the frequency Fq of the RF signal 102*q*,
and so on. For example, the correlator 120 correlates two or
more PDDs that are detected to be for a same RF pulse. For
example, the correlator 120 generates a correlation signal
233 indicative of the correlation of the two or more PDDs.
Based on an observed frequency of the RF pulse at different
ADCs having the different sampling rates and the correlation
signal 233 being indicative of the correlated two or more
PDDs, a frequency measurement module 234 determines a
true Nyquist zone of the RF pulse, based on which the true
frequency of the RF pulse may be determined, as described
below.

FIG. 3 illustrates a correlator 120 of the system 100 of
FIG. 1, wherein the correlator 120 is configured to correlate
two PDDs, to facilitate frequency measurement of an RF
pulse of an RF signal 102 received by the plurality of ADCs
104*a*, 104*b*, 104*c*, . . . , 104N of the system 100 of FIG. 1,
in accordance with an embodiment of the present disclosure.
The correlator 120 and its various components may be
implemented, for example, in hardware using a hardware
description language (HDL). In some examples, the corr-
elator 120 is includes one or more memory blocks, gate level
arrays, application specific integrated circuits (ASICs) or
purpose-built semiconductor, field programmable gate
arrays (FPGAs), central processing units (CPUs), graphics
processing units (GPUs), and/or other types of processing
units configured to operate on data in the digital domain. The
example correlator 120 of FIG. 3 shows delay, correlation,
and reducer blocks, each of which can be implemented in
hardware as described here. Other examples may be inte-
grated differently but still provide similar functionality, and
may be implemented with any combination of hardware,
firmware, and software.

The correlator 120 includes a plurality of correlation
modules 202*a*, 202*b*, 202*c*, . . . 202N. The correlation
module 202*a* aims to correlate each of PDDa0, PDDa1,
PDDa2, PDDa3, . . . generated by the digital receiver 108*a*
with a plurality of PDDs generated by one or more other
digital receivers. Similarly, the correlation module 202*b*
aims to correlate each of PDDb0, PDDb1, PDDb2,
PDDb3, . . . generated by the digital receiver 108*b* with a
plurality of PDDs generated by one or more other digital
receivers. Similarly, the correlation module 202N aims to
correlate each of PDDN0, PDDN1, PDDN2, PDDN3, . . .
generated by the digital receiver 108N with a plurality of
PDDs generated by one or more other digital receivers, and
so on. In FIG. 3, the correlation module 202*a* is illustrated
in detail, and the other the correlation modules 202*b*, . . . ,
202N will be apparent based on the description of the
correlation module 202*a*.

The PDDa0, PDDa1, PDDa2, PDDa3, . . . generated by
the digital receiver 108*a* is received by the correlation
module 202*a* through a delay module 204*a*; the PDDb0,
PDDb1, PDDb2, PDDb3, . . . generated by the digital
receiver 108*b* is received by the correlation module 202*b*
through a delay module 204*b*; the PDDN0, PDDN1,
PDDN2, PDDN3, . . . generated by the digital receiver 108N
is received by the correlation module 202N through a delay
module 204N, and so on, as illustrated in FIG. 3. Each of the
delay modules 204*a*, . . . , 204N applies a corresponding
delay to the corresponding PDDs.

In an example, one or more of the delay modules
204*a*, . . . , 204N are implemented using corresponding
block random access memory (BRAM). In an example, the
delay modules 204*a*, . . . , 204N facilitate substantial
alignment of different inputs of the PDDs to the correspond-
ing correlation modules.

For example, continuing with the above example where
each of the PDDa6, PDDb6, PDDc6, and PDDd6 generated
by the respective ADCs 108*a*, 108*b*, 108*c*, and 108*d* are for
the same pulse 204*pb* of the RF signal 102*p*, the ADCs 108*a*,
108*b*, 108*c*, and 108*d* have different sampling rates. Accord-
ingly, the PDDa6, PDDb6, PDDc6, and PDDd6 may be
generated at different point in time (e.g., generation of the
PDDa6, PDDb6, PDDc6, and PDDd6 may not be synchro-
nized). This creates misalignments in the arrival of the PDDs
to the respective correlation modules, due to the different
processing times of the ADCs and/or the digital receivers.

For example, a single RF pulse causes generation of a
corresponding PDD from each digital receiver at different
times. Accordingly, without the delay modules, the PDDa6,
PDDb6, PDDc6, and PDDd6 (all of which may be for the
same pulse 204*pb*) may be received by the corresponding
correlation modules 202*a*, 202*b*, 202*c*, 202*d* at different
times. The delay modules 204*a*, . . . , 204N facilitate in
removal or at least reduction of this time misalignment, such
that the PDDa6, PDDb6, PDDc6, and PDDd6 may be
received by the corresponding correlation modules 202*a*,
202*b*, 202*c*, 202*d* at substantially the same time (or received
with a reduced difference in time of receiving the PDDs).
For example, ADCs that have a relatively slower sampling
time may have a shorter delay at the corresponding delay
module, and ADCs that have a relatively faster sampling
time may have a longer delay at the corresponding delay
module.

Described below is the correlation module 202*a*, and
other correlation modules 202*b*, . . . , 202N will be apparent
based on the description of the correlation module 202*a*. The
correlation module 202*a* includes a buffer 208*a* configured
to receive corresponding PDDs from the digital receiver
108*a* and through the delay modules 204*a*, such as PDDa0,
PDDa1, PDDa2, and so on. In an example, the buffer 208*a*
is a first in-first out (FIFO) buffer, such as a first-word
fall-through (FWFT) FIFO buffer. A minimum amount of
buffering space of the buffer 208*a* (e.g., a minimum depth of
the buffer 208*a*) is based on a number of PDDs from other
digital receivers that are to be compared to a specific PDD
from the digital receiver 108*a*, for example. This minimum
depth ensures that the PDDs are not dropped or lost prior to
a comparison operation. In an example, each PDD of the
PDDa0, PDDa1, PDDa2, and so on are compared with M
number of PDDs from the digital receiver 108*b*, M number
of PDDs from the digital receiver 108*c*, M number of PDDs
from the digital receiver 108N, and so on (e.g., see FIG. 4
described below), where M is a positive integer that is at
least 2. In an example, the buffer 208 may have a depth of
at least M², such that the buffer 208*a* can buffer at least M²
number of PDDs. In an example, a PDD is held static in the
buffer 208*a*, until the PDD is compared to a plurality of other
PDDs, as described below.

The correlation module 202*a* further includes a plurality
of buffers 220*ab*, 220*ac*, . . . 220*a*N, each buffer 220 is
configured to receive and buffer PDDs from a corresponding
digital receiver 108. For example, buffer 220*ab* within the
correlation module 202*a* is configured to buffer PDDb0,
PDDb1, PDDb2, PDDb3, . . . from digital receiver 108*b*.
Similarly, buffer 220*ac* within the correlation module 202*a*
is configured to buffer PDDc0, PDDc1, PDDc2, PDDc3, . . . from digital receiver 108c. Similarly, buffer 220aN within the correlation module 202a is configured to buffer PDDN0, PDDN1, PDDN2, PDDN3, . . . from digital receiver 108N, and so on.

In an example, each of the buffers 220ab, 220ac, . . . , 220aN is a circular buffer, such as a circular dynamic random access memory (DRAM). In the above described example where the buffer 208a has a minimum depth of $M^2$, each of the buffers 220ab, 220ac, . . . , 220aN has a minimum depth of M, such that each of the buffers 220ab, 220ac, . . . , 220aN can store at least M number of PDDs at a given time.

The correlation module 202a further includes a comparator 212a. In an example, the comparators 212a, b, . . . , N may be implemented using one or more gate level arrays, circuits, ASICs, FPGAs, CPUs, GPUs, and/or other types of processing units suitable for process data in the digital domain.

Figure 4:
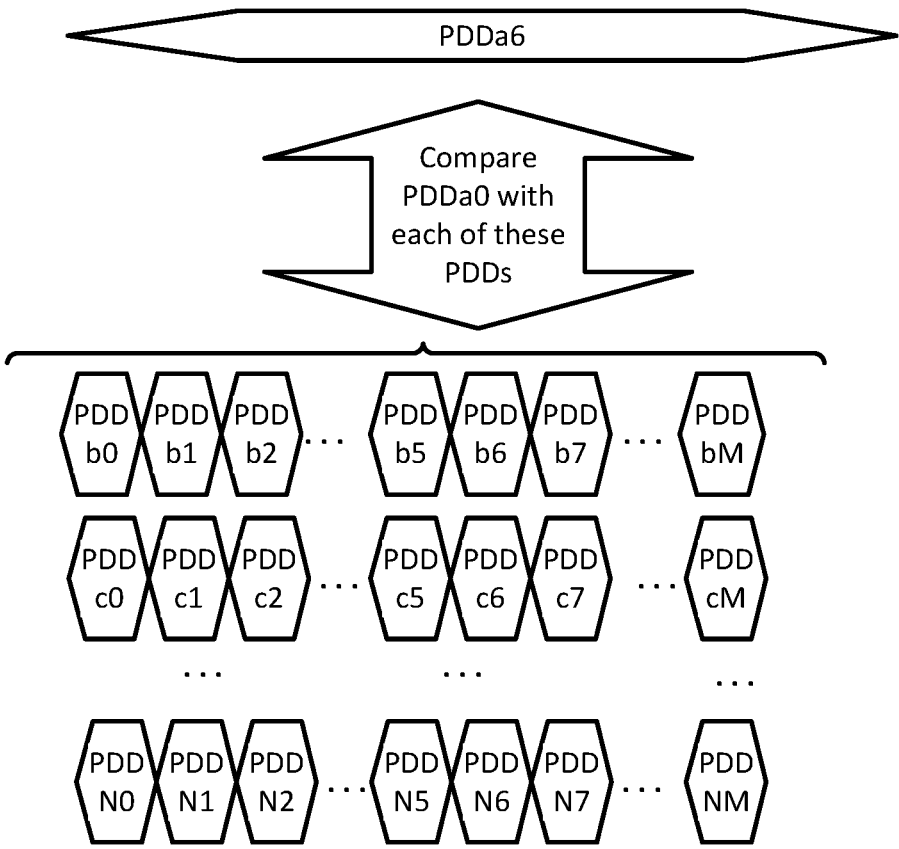
FIG. 4 illustrates a comparison between a PDD signal generated by a digital receiver to a plurality of other PDD signals generated by each of a plurality of other digital receivers, in accordance with an embodiment of the present disclosure.

The comparator 212a is configured to compare each of the PDDa0, PDDa1, PDDa2, and so on (e.g., generated by the digital receiver 108a and stored in the buffer 208a) to a plurality of PDDs generated by each of the plurality of digital receivers 108b, 108c, . . . , 108N and stored in the buffers 220ab, 220ac, . . . , 220aN. FIG. 4 illustrates a comparison between an example PDDa6 generated by a digital receiver 108a to a plurality of PDDs generated by each of a plurality of digital receivers 108b, 108c, . . . , 108N, in accordance with an embodiment of the present disclosure. For example, PDDa6 stored in the buffer 208a is compared by the comparator 212a with PDDb0, PDDb1, PDDb2, . . . , PDDbM generated by the digital receiver 108b and stored in the buffer 220ab; PDDa6 stored in the buffer 208a is also compared by the comparator 212a with PDDc0, PDDc1, PDDc2, . . . , PDDcM generated by the digital receiver 108c and stored in the buffer 220ac; and so on, and PDDa6 stored in the buffer 208a is also compared by the comparator 212a with PDDN0, PDDN1, PDDb2, . . . , PDDNM generated by the digital receiver 108N and stored in the buffer 220aN.

Thus, PDDa6 is compared to (M+1) number of PDDs generated by each digital receiver 108b, . . . , 108N. Similarly, PDDa1 is compared to (M+1) number of corresponding PDDs generated by each digital receiver 108b, . . . , 108N. Similarly, PDDa2 is compared to (M+1) number of corresponding PDDs generated by each digital receiver 108b, . . . , 108N. Similarly, PDDa3 is compared to (M+1) number of corresponding PDDs generated by each digital receiver 108b, . . . , 108N, and so on.

The number M is a positive integer that is at least 1, and is implementation specific. In the example of FIG. 4, M may be equal to 10, such that PDD6 is compared with 11 PDDs from each digital receiver 108b, . . . , 108N. For example, PDDa6 is compared with PDDb0, PDDb1, PDDb2, . . . , PDDb11, and with PDDc0, PDDc1, PDDc2, . . . , PDDc11, and with PDDN0, PDDN1, PDDb2, . . . , PDDN11, and so on. In an example, a large value of M increases circuit complexity and cost, but may result in simultaneous detection and correlation between multiple PDD pairs. On the other hand, a smaller value of M decreases circuit complexity and cost, but may result in missed detection of a matching pair.

Described below is the comparison operation between PDDa6 and other PDDs from other digital receivers 108b, . . . , 108N, as illustrated in FIG. 4. Such description also applies to a comparison between PDDa0 and other PDDs from other digital receivers 108b, . . . , 108N; applies to a comparison between PDDa1 and other PDDs from other digital receivers 108b, . . . , 108N; and so on, and applies to any comparison operation between a specific PDD from a digital receiver and other PDDs from other digital receivers.

In an example, the comparator 212 compares one or more attributes stored in the PDDa6 to corresponding one or more attributes stored in each of PDDb0, PDDb1, PDDb2, . . . , PDDbM, PDDc0, PDDc1, PDDc2, . . . , PDDcM, PDDN0, PDDN1, PDDb2, . . . , PDDNM. For example, the attributes compared by the comparator 212 includes one or more of an amplitude, an observed frequency, and TOA associated with the PDDs.

For example, the comparator 212 aims to find PDDs which are for the same RF pulse. For example, each of PDDa6, PDDb6, PDDc6, and PDDd6 are generated by the corresponding digital receivers for the same RF pulse 204pb. So, ideally, the comparator 212 should find a match between PDDa6 and each of PDDb6, PDDc6, and PDDd6.

In an example, when comparing PDDa6 and PDDb6, the comparator 212 compares the amplitude indicated by these two PDDs, where an amplitude indicated by a PDD is a measured amplitude of a corresponding RF pulse for which the PDD was generated by the corresponding digital receiver 108. In an example, when comparing two PDDs, the comparator 212 determines if the amplitudes indicated by the two PDDs are within a threshold amplitude (such as a first amplitude indicated by a first PDD is within X % or within Y dB of a second amplitude indicated by a second PDD, where the X and Y represent the threshold). If the two amplitudes are within the threshold amplitude, the result indicates an amplitude match between the two PDDs. If the two amplitudes differ by more than the threshold amplitude, the result indicates an amplitude mismatch between the two PDDs. In an example, the amplitude of the PDD6 can be matched with the amplitude of one or more of PDDb0, . . . , PDDbM, and can be matched with the amplitude of one or more of PDDc0, . . . , PDDcM, and can be matched with the amplitude of one or more of PDDN0, . . . , PDDNM, for example. Thus, in an example, amplitude matching may not be enough to find matching PDD pairs (e.g., because an amplitude of a pulse may be same as an amplitude of one or more other pulses), and in addition to (or instead of) amplitude, a frequency and/or a TOA matching are also performed, as described below.

In an example, when comparing PDDa6 and PDDb6, the comparator 212 also compares the TOA indicated by these two PDDs, where a TOA indicated by a PDD is a time of arrival of a corresponding RF pulse at the corresponding ADC, as described above. In an example, when comparing two PDDs, the comparator 212 determines if the TOAs indicated by the two PDDs are within a threshold time period or threshold number of clock cycles (such as a first TOA indicated by a first PDD is Z milliseconds of a second TOA indicated by a second PDD, where the Z represent the threshold time period). If the two TOAs are within the threshold time period or clock cycles, the result indicates a TOA match between the two PDDs. If the two TOAs differ by more than the threshold time period, the result indicates a TOA mismatch between the two PDDs. In an example, for TOA comparison, time roll-over is accounted for. For example, a TOA for a PDD can be represented as a Q bit vector, where Q can be an appropriate integer such as 16, or 32, or 64 for example. When keeping track of TOA, if the maximum value of the counter (e.g., x"FFFFFFF") if reached, the system time rolls over the TOA count to x"00000000". Assume PDDa6 and PDDb6 are for the same pulse, and should ideally indicate same TOA. Due to noise and imperfection, assume PDDa6 has a value of x"FFFFFFF", and PDDb6 has a value of x"00000000." A simple comparison and subtraction between these two PDD values would appear to be large. However, when accounting for time rollover, these two values are apart by merely one count (e.g., adding 1 to x"FFFFFFFF" rolls over to value x"00000000"). Thus, in an example, for TOA comparison, time roll-over is accounted for.

In an example, when comparing PDDa6 and PDDb6, the comparator 212 also compares the observed frequency indicated by these two PDDs. As described above, the observed frequency may be an alias frequency of the RF pulse, due to possible under-sampling of the RF pulse by the corresponding ADC. For example, as also described above, applying Nyquist theorem, if the frequency of the RF pulse 204pa is 2.2 GHz and the sampling frequency of the ADC 104a is 1 GHz, the observed frequency of the RF pulse 204pa at the digital receiver 108a may be 200 MHz. Similarly, if the sampling frequency of the ADC 104b is 1.01 GHz, the observed frequency of the RF pulse 204pa at the digital receiver 108b may be 180 MHz. Thus, the PDD corresponding to the RF pulse 204pa, as generated by the digital receiver 108a, may indicate an observed frequency of 200 MHz; and the PDD corresponding to the RF pulse 204pa, as generated by the digital receiver 108b, may indicate an observed frequency of 180 MHz.

Figure 5A:
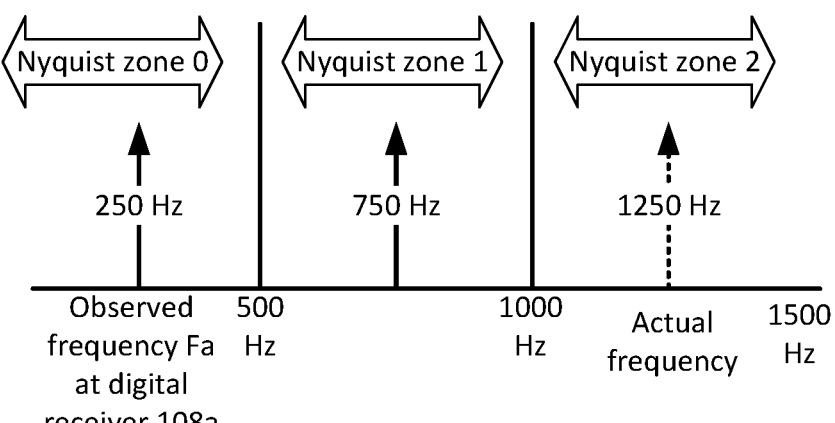
FIGS. 5A and 5B illustrate example Nyquist zones for different sampling rates for an example RF pulse, in accordance with an embodiment of the present disclosure.
Figure 5B:
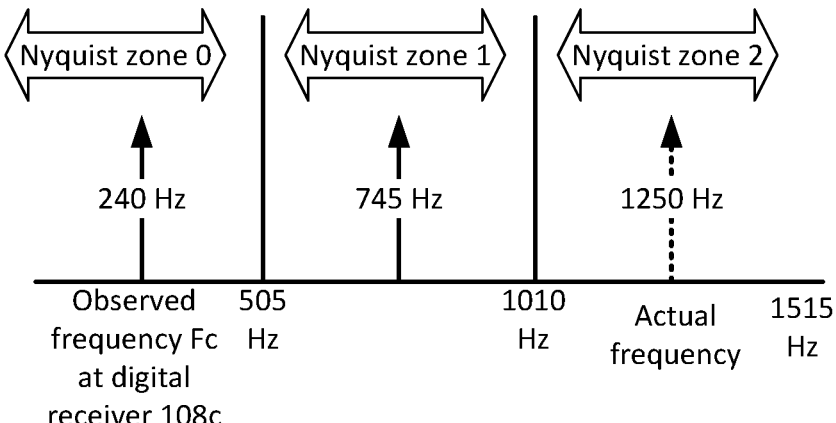

In one embodiment, the frequency comparison of two PDDs at the comparator 212a is based on subtraction of the observed frequencies of the two PDDs, such as subtraction of the observed frequencies of the PDDa6 and PDDb6. Due to the specific and preconfigured sampling rates of the ADCs 104a and 104b, the differences in the observed frequencies would be unique. FIGS. 5A and 5B illustrate example Nyquist zones for different sampling rates for an example RF pulse, in accordance with an embodiment of the present disclosure. For example, in FIG. 5A, the sampling frequency Fsa of the ADC 104a is assumed to be 1000 Hz, whereas the actual pulse is assumed to have a frequency of 1250 Hz. The first Nyquist zone (or Nyquist zone 0) for the sampling frequency Fsa of ADC 104a is 0 to 500 Hz, the second Nyquist zone (or Nyquist zone 1) for the sampling frequency Fsa is 500 to 1000 Hz, the third Nyquist zone (or Nyquist zone 2) for the sampling frequency Fsa is 1000 to 1500 Hz, and so on. In an example, the observed frequency Fa at digital receiver 108a for this pulse may be 250 Hz in the Nyquist zone 0, which is different from the actual frequency of 1250 Hz.

In FIG. 5B, the sampling frequency Fsc of the ADC 104c is assumed to be 1010 Hz, whereas the actual pulse is assumed to be 1250 Hz. The first Nyquist zone (or Nyquist zone 0) for the sampling frequency Fsc for ADC 104c is 0 to 505 Hz, the second Nyquist zone (or Nyquist zone 1) for the sampling frequency Fsc is 505 to 1010 Hz, the third Nyquist zone (or Nyquist zone 2) for the sampling frequency Fsc is 1010 to 1515 Hz, and so on. In an example, the observed frequency Fc at digital receiver 108c for this pulse may be 260 Hz in the Nyquist zone 0, which is different from the actual frequency of 1250 Hz. In FIGS. 5A and 5B, the frequencies correctly wrap back to Nyquist Zone 0, whereas the actual frequency is located in Nyquist Zone 2 for both the figures.

In one embodiment, using knowledge of the sampling frequencies, it may be possible to detect if a pair of observed frequencies in a corresponding pair of PDDs match each other (e.g., are for the same RF pulse, or different RF pulses), and also what Nyquist zone the actual frequency belongs to, as described below. Note that the comparison of the observed or aliased frequencies of the two PDDs are done in Nyquist zone 0 of the corresponding ADCs.

In an example, the frequency comparison is based on of the Chinese Remainder Theorem, where due to the different sampling frequencies, there are a limited number of possible observed frequencies for a given RF pulse. For example, in FIG. 5A, for the sampling rate of 1000 Hz of the ADC 104a, the observed frequency (e.g., as indicated by a PDD from the digital receiver 108a) is 250 Hz, which implies that the actual frequency may be 250 Hz, or 750 Hz, or 1250 Hz, or 1750 Hz, and so on, e.g., depending on which Nyquist zone the pulse actually belongs. Thus, 250 Hz, or 750 Hz, or 1250 Hz, or 1750 Hz are possible alias frequency of the pulse, as indicated with a PDD generated by the digital receiver 108a.

Similarly, in FIG. 5B, for the sampling rate of 1010 Hz of the ADC 104c, the observed frequency (e.g., as indicated by a PDD from the digital receiver 108c) is 240 Hz, which implies that the actual frequency may be 240 Hz, or 745 Hz, or 1250 Hz, or 1755 Hz, and so on, e.g., depending on which Nyquist zone the pulse actually belongs. Thus, 240 Hz, or 745 Hz, or 1250 Hz, or 1755 Hz are possible alias frequency of the pulse, as indicated with a PDD generated by the digital receiver 108c.

Hence, there is a possible matching frequency of 1250 Hz (shown in dotted line in FIGS. 5A and 5B) for the PDD of FIG. 5A and the PDD of FIG. 5B. Thus, in this scenario, by comparing the observed frequency of 250 Hz from the digital receiver 108a (e.g., as indicated by a PDD from the digital receiver 108a) and the observed frequency of 240 Hz from the digital receiver 108c (e.g., as indicated by a PDD from the digital receiver 108c), the comparator 212a may conclude that the two corresponding PDDs may have a frequency match.

Thus, as described above, the comparator 212a compares PDDs from the digital receiver 108a with PDDs from other digital receivers 108a, . . . , 108N, to determine one or more matches among the PDDs, where the comparator 212a compares one or more attributes of the PDDs to determine such matches, and where the attributes being compared includes one or more of (such as two or more of, or all of) amplitude, TOA, and/or observed frequency. If one or more (or all three) of amplitude, TOA, and/or observed frequency of two PDDs match, then the PDD from the digital receiver 108a is considered to be matching with the PDD from the other digital receiver.

FIGS. 6A and 6B each illustrates an example matching scenario between various PDDs within the correlator 120 of the system 100 of FIG. 1, in accordance with an embodiment of the present disclosure.

For example, referring to FIG. 6A and continuing with the above described example where each of the PDDa5, PDDb5, PDDc5, and PDDd5 generated by the respective ADCs 108a, 108b, 108c, and 108d are for the same pulse 204pa of the RF signal 102p, PDDa5 should ideally match with each of PDDb5, PDDc5, and PDDd5, as illustrated in FIG. 6A. For example, the amplitudes and/or TOAs of the RF pulse 204pa, as indicted by these PDDs, should ideally be substantially the same (e.g., within a threshold amplitude and/or threshold time period of each other), as described above. Similarly, the comparator 212a should match the observed frequency in the PDDa5 with the observed frequencies of each of PDDb5, PDDc5, and PDDd5. However, due to noise and/or one or more other technical limitations of the system 100, the comparator 212a may not (or may) be able to match the PDDa5 with each of PDDb5, PDDc5, and PDDd5. In the example of FIG. 6A, the comparator 212a is able to match PDDa5 with PDDb5 and PDDc5, but not PDDd5.

Also, as described above, the correlation module 202b also includes a corresponding comparator 212b, the correlation module 202*c* also includes a corresponding comparator 212*c*, the correlation module 202*d* also includes a corresponding comparator 212*d*, and so on. Ideally, the comparator 212*b* should be able to match PDDb5 to PDDa5, and the comparator 212*c* should be able to match PDDc5 to PDDa5. But due to noise and/or one or more other technical limitations of the system 100, assume that the PDDc5 matches with PDDa5 at the comparator 212*c*, but the PDDb5 does not match with PDDa5 at the comparator 212*b*, as illustrated in FIG. 6A.

Referring now to FIG. 6B and continuing with the other above described example where each of the PDDa6, PDDb6, PDDc6, and PDDd6 generated by the respective ADCs 108*a*, 108*b*, 108*c*, and 108*d* are for the same pulse 204*pb* of the RF signal 102*p*, PDDa6 should ideally match with each of PDDb6, PDDc6, and PDDd6. However, due to noise and/or one or more other technical limitations of the system 100, the comparator 212*a* may not (or may) be able to match the PDDa6 with each of PDDb6, PDDc6, and PDDd6. In the example of FIG. 6B, the comparator 212*a* is able to match PDDa6 with PDDc6 and PDDd6, but not with PDDb6. Furthermore, assume that the PDDc6 matches with PDDa6 at the comparator 212*c*, and also the PDDd6 matches with PDDa6 at the comparator 212*d*, as illustrated in FIG. 6B.

Referring again to FIG. 3, each comparator 212*a*, 212*b*, and so on is configured to output corresponding PDD matches. For example, referring to FIGS. 3, 6A, and 6B, the comparator 212*a* outputs match between PDDa5 and each of PDDb5 and PDDc5; and also, outputs match between PDDa6 and each of PDDc6 and PDDd6. Similarly, the comparator 212*c* outputs a match between PDDc5 and PDDa5, and also a match between PDDc6 and PDDa6. Similarly, the comparator 212*d* outputs a match between PDDd6 and PDDa6.

Referring again to FIG. 3, the correlation module 202*a* further includes a corresponding latch 216*a* configured to receive and latch (such as store temporarily) the matches output by the corresponding comparator 212*a*. Similarly, the correlation module 202*b* further includes a corresponding latch 216*b* configured to receive and latch (such as store temporarily) the matches output by the corresponding comparator 212*b*, and so on.

The correlator 120 further includes a reducer module 230 configured to receive the matches from the various correlation modules 202*a*, 202*b*, . . . , 202N. The reducer module 230 may be implemented using one or more gate level arrays, circuits, ASICs, FPGAs, CPUs, GPUs, and/or other types of processing units suitable for process data in the digital domain. In one embodiment, the reducer module 230 reduces the comparison results to two matching PDDs for a given RF pulse. For example, in the scenario illustrated in FIG. 6A, the reducer module 230 receives the match between PDDa5 and each of PDDb5 and PDDc5, and also receives the match between PDDc5 and PDDa5. Thus, there is a two-way match between PDDa5 and PDDc5 (e.g., PDDa5 matches with PDDc5 at the comparator 212*a*, and PDDc5 matches with PDDa5 at the comparator 212*c*). Thus, PDDa5 and PDDc5 are reciprocal pairs having a match in both directions. If a reciprocal matching pair is available, the reducer module 230 eliminates any non-reciprocal matching. For example, in FIG. 6A, PDDa5 matches with PDDb5, but PDDb5 doesn't match with PDDa5. Accordingly, matching between PDDa5 and PDDb5 is non-reciprocal, and hence, eliminated or ignored by the reducer module 230. Thus, in FIG. 6A, the match between PDDa5 and PDDc5 are the only reciprocal match, and hence, the reducer module 230 outputs PDDc5 and PDDa5 as best matching PDDs for this RF pulse. Note that in an example, the directional or reciprocal matching is a result of the above described frequency matching, where it may be possible to have a match in one direction, but not the other. This may occur, for example, when a pulse from one receiver matches to multiple pulses from a different receiver, but no match in the opposite direction. On the other hand, in FIG. 6B, there are two reciprocal matches—one between PDDa6 and PDDc6 (e.g., both at comparators 212*a* and 212*c*), and another between PDDa6 and PDDd6 (e.g., both at comparators 212*a* and 212*d*). In case multiple reciprocal matches are available for a same RF pulse (such as PDDa5 having reciprocal matching with two other PDDs), a match with relatively closer or better matching attributes is selected. For example, the reciprocal pair having relatively closer amplitude match, relatively closer TOA match, and/or including PDDs having lower signal to noise ratio (SNR) is selected as a best reciprocal match pair. In an example, the correlator 120 (such as the reducer module 230) generates a correlation signal 233 indicative of the correlation between the best matched reciprocal pair of PDDs.

Referring again to FIGS. 1 and 3, the system 100 further includes a frequency measurement module 234 configured to receive, from the reducer module 230 of the correlator 120 and corresponding to each RF pulse, the correlation signal 233 indicative of the best matched reciprocal pair of PDDs. For example, as described with respect to FIG. 6A, for the RF pulse 204*pa*, the frequency measurement module 234 receives from the reducer module 230 the correlation signal 233 indicative of the reciprocal matching pair of PDDa5 and PDDc5. As described with respect to FIG. 6B, for the RF pulse 204*pb*, the frequency measurement module 234 receives from the reducer module 230 a selected one of two reciprocal matches (i) PDDa6 and PDDc6, or (ii) PDDa6 and PDDd6, where the selection is made at the reducer module 230 based on the above described one or more criteria (e.g., better amplitude matching and/or better TOA matching). The frequency measurement module 234 may be implemented, for example, in hardware using a hardware description language (HDL). In some examples, the frequency measurement module 234 may be implemented using one or more gate level arrays, circuits, ASICs, FPGAs, CPUs, GPUs, and/or other types of processing units suitable for process data in the digital domain.

In one embodiment, for a given RF pulse, based on the received matching pair of PDDs, the frequency measurement module 234 measures a frequency of the RF pulse. For example, in the scenario described with respect to FIG. 6A, the frequency measurement module 234 receives from the reducer module 230 the reciprocal matching pair of PDDa5 and PDDc5 for the RF pulse 204*pa*, and measures a frequency of the RF pulse 204*pa* based on the observed frequencies indicated by each of the PDDa5 and PDDc5, and the sampling frequencies Fsa and Fsc of the ADCs 104*a* and 104*c*, respectively.

For example, assume that the observed frequencies indicated by each of the PDDa5 and PDDc5 are Fa and Fc, respectively. Also, as described above, the sampling frequencies of the ADCs 104*a* and 104*c* are Fsa and Fsc, respectively. Also assume that Fsc>Fsa. Then an actual Nyquist zone Nyq_zone of the sampling frequency Fsa, which encompasses or includes the actual frequency of the RF pulse 204*pa*, can be detected as follows:

$$\text{Nyq\_zone} = \text{round}\left((Fc - Fa)/(Fsc - Fsa) * 2 - 1\right), \qquad \text{Equation 1}$$

$$\text{if Nyq\_zone} \geq 0$$

Equation 1 is valid if an odd-numbered Nyquist zone includes the actual RF pulse frequency, in which case the calculated Nyquist zone is greater than or equal to zero.

If the calculated Nyquist zone in equation 1 is negative, then this implies that the actual Nyquist zone of the sampling frequency Fsa, which encompasses or includes the actual frequency of the RF pulse 204pa, is an even numbered Nyquist zone, and can be detected as follows:

$$\text{Nyq\_zone} = \text{round}\left((Fc - Fa)/(Fsc - Fsa) * (-2)\right). \qquad \text{Equation 2}$$

Thus, the actual Nyquist zone of the pulse 204pa is detected in accordance with equations 1 or 2.

For example, for the example of FIGS. 5A and 5B, Fsa is less than Fsc. Accordingly, because the Nyquist zone 2 of Fsa includes the actual frequency of the RF pulse, the output of equation 2 will be Nyquist zone 2 of the sampling frequency Fsa of 1000 Hz.

Once the Nyquist zone of the sampling frequency Fsa (e.g., in which the actual frequency of the pulse 204pa is included) is detected, the actual frequency Factuai of the pulse 204pa is measured as:

$$F_{actual} = Fa + \text{Nyq\_Zone} * Fsa/2. \qquad \text{Equation 3}$$

For example, applying equation 3 to the scenario of FIG. 5A, the actual frequency is determined as 250+2*1000/2, which is equal to 1250 Hz, as indicated in FIG. 5A. Equation 3 may also be applied to the scenario of FIG. 5B, in which the actual frequency is determined as 240+2*1010/2, which is equal to 1250 Hz, as also indicated in FIG. 5B.

Figure 7:
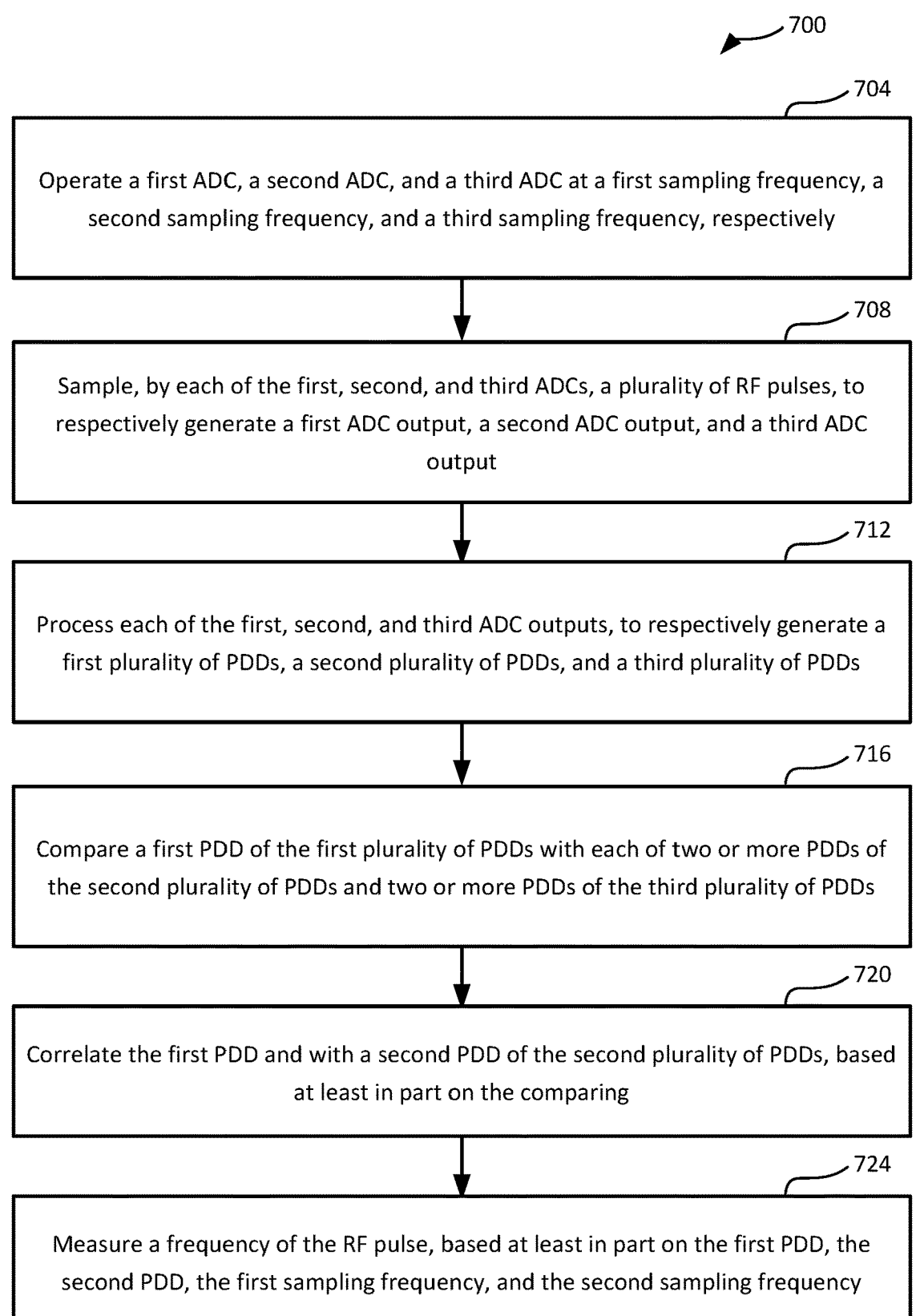
FIG. 7 illustrate a flowchart depicting a method of measuring a frequency of an RF pulse of a plurality of RF pulses received by the system of FIG. 1, in accordance with an embodiment of the present disclosure.

FIG. 7 illustrate a flowchart depicting a method 700 of measuring a frequency of an RF pulse of a plurality of RF pulses received by the system 100 of FIGS. 1 and 3, in accordance with an embodiment of the present disclosure.

At 704 of method 700, a first ADC 104a, a second ADC 10b, and a third ADC 104c are operated at a first sampling frequency Fsa, a second sampling frequency Fsb, and a third sampling frequency Fsc, respectively, as described with respect to FIG. 1. Although three ADCs are described in FIG. 7, there may be any number of ADCs, as described above.

The method 700 proceeds from 704 to 708. At 708, each of the first, second, and third ADCs 104a, 104b, 104c samples a plurality of RF pulses (e.g., RF signals 102p, . . . , 102t, where an example signal 102p includes at least two RF pulses 204pa and 204pb). The ADCs 104a, 104b, 104c respectively generate a first ADC output 105a, a second ADC output 105b, and a third ADC output 105c, as also described above.

The method 700 proceeds from 708 to 712. At 712, each of the first, second, and third ADC outputs 105a, 105b, 105c are processed, e.g., by the digital receivers 108a, 108b, 108c, respectively. The digital receivers 108a, 108b, 108c process the respective ADC outputs, to respectively generate a first plurality of PDDs (e.g., PDDa0, PDDa1, PDDa2, PDDa3, and so on), a second plurality of PDDs (e.g., PDDb0, PDDb1, PDDb2, PDDb3, and so on), and a third plurality of PDDs (e.g., PDDc0, PDDc1, PDDc2, PDDc3, and so on), as illustrated in FIG. 1. In an example, each PDD of the first, second, and third plurality of PDDs is indicative of one or more attributes of a corresponding RF pulse of the plurality of RF pulses.

The method 700 proceeds from 712 to 716. At 716, a first PDD (such as PDDa0) of the first plurality of PDDs is compared with each of two or more PDDs of the second plurality of PDDs (e.g., PDDb0, PDDb1, PDDb2, PDDb3, and so on) and two or more PDDs of the third plurality of PDDs (e.g., PDDc0, PDDc1, PDDc2, PDDc3, and so on), as described above with respect to FIG. 4.

The method 700 proceeds from 716 to 720. At 720, the first PDD is correlated with a second PDD of the second plurality of PDDs (or a third PDD of the third plurality of PDDs), based at least in part on the comparing, e.g., as described with respect to FIGS. 6A and 6B. For example, in FIG. 6A, the PDDa0 is correlated with PDDc2. Correlating the two PDDs imply that the correlator 120 has determined that the two PDDs are associated with a same RF pulse. Various example techniques for correlating the two PDDs have been described above.

The method 700 proceeds from 720 to 724. At 724, a frequency of the RF pulse is measured, based at least in part on the first PDD, the second PDD, the first sampling frequency, and the second sampling frequency, e.g., as described above with respect to equations 1, 2, and/or 3.

Note that the processes in method 700 are shown in a particular order for ease of description. However, one or more of the processes may be performed in a different order or may not be performed at all (and thus be optional), in accordance with some embodiments. Numerous variations on method 700 and the techniques described herein will be apparent in light of this disclosure.

Further Example Examples

The following examples pertain to further examples, from which numerous permutations and configurations will be apparent.

Example 1. A system comprising: a first analog to digital converter (ADC) configured to operate at a first sampling frequency, and a second ADC configured to operate at a second sampling frequency different from the first sampling frequency, wherein each of the first and second ADCs are configured to receive a plurality of radio frequency (RF) pulses, and generate a first ADC output and a second ADC output, respectively; a first digital receiver to process the first ADC output and generate a first plurality of pulse description data signals (PDDs), and a second digital receiver to process the second ADC output and generate a second plurality of PDDs, wherein each PDD of the first and second plurality of PDDs is indicative of attributes of a corresponding RF pulse of the plurality of RF pulses; and a correlator configured to corelate a first PDD of the first plurality of PDDs with a second PDD of the second plurality of PDDs, and generate a correlation signal indicative of the correlation of the first PDD with the second PDD, wherein each of the first PDD and the second PDD includes attributes of a same RF pulse of the plurality of RF pulses.

Example 2. The system of example 1, further comprising: a third ADC configured to operate at a third sampling frequency different from each of the first and second sampling frequencies, wherein the third ADC is configured to receive the plurality of RF pulses, and generate a third ADC output; and a third digital receiver to process the third ADC output and generate a third plurality of PDDs.

Example 3. The system of example 2, wherein to corelate the first PDD of the first plurality of PDDs with the second PDD of the second plurality of PDDs, the correlator is configured to: compare the first PDD with each of two or more PDDs of the second plurality of PDDs and two or more PDDs of the third plurality of PDDs, to determine a first match between the first PDD and the second PDD, and to further determine a second match between the first PDD and a third PDD of the third plurality of PDDs; and select, from the first and second matches, the first match between the first PDD and the second PDD, thereby correlating the first PDD with the second PDD.

Example 4. The system of example 3, wherein to select the first match from the first and second matches, the correlator is configured to: determine that the first PDD matches with the second PDD, and the second PDD matches with the first PDD, to thereby determine that the first match between the first PDD and the second PDD is a reciprocal match; determine that the first PDD matches with the third PDD, and the third PDD does not match with the first PDD, to thereby determine that the second match between the first PDD and the third PDD is a non-reciprocal match; and select, from the first and second matches, the first match, based on the first match being a reciprocal match and the second match being a non-reciprocal match.

Example 5. The system of any one of examples 3-4, wherein to select the first match from the first and second matches, the correlator is configured to: determine that an attribute in the first and second PDDs differ by a first difference, and the attribute in the first and third PDDs differ by a second difference greater than the first difference, wherein the attribute is one of a corresponding RF pulse amplitude and a corresponding RF pulse time of arrival (TOA); and select, from the first and second matches, the first match, based on the second difference being greater than the first difference.

Example 6. The system of any one of examples 1-5, wherein to corelate the first PDD of the first plurality of PDDs with the second PDD of the second plurality of PDDs, the correlator is configured to: compare, at a first comparator, one or more attributes of the first PDD with one or more attributes of the second PDD, to determine that the second PDD is a match with the first PDD; compare, at a second comparator different from the first comparator, one or more attributes of the second PDD with one or more attributes of the first PDD, to determine that the first PDD is a match with the second PDD; determine that the first PDD and the second PDD have reciprocal matching, based at least in part on (i) the second PDD being a match with the first PDD and (ii) the first PDD being a match with the second PDD; and corelate the first PDD with the second PDD, based at least in part on the first PDD and the second PDD having the reciprocal matching.

Example 7. The system of any one of examples 1-6, wherein to corelate the first PDD of the first plurality of PDDs with the second PDD of the second plurality of PDDs, the correlator is configured to: compare one or more attributes of the first PDD with one or more attributes of the second PDD, to determine that the second PDD is a match with the first PDD; wherein the one or more attributes of the first PDD comprise an amplitude of the RF pulse, as sampled by the first ADC and detected by the first digital receiver; and wherein the one or more attributes of the second PDD comprise an amplitude of the RF pulse, as sampled by the second ADC and detected by the second digital receiver.

Example 8. The system of any one of examples 1-7, wherein to corelate the first PDD of the first plurality of PDDs with the second PDD of the second plurality of PDDs, the correlator is configured to: compare one or more attributes of the first PDD with one or more attributes of the second PDD, to determine that the second PDD is a match with the first PDD; wherein the one or more attributes of the first PDD comprise a time of arrival (TOA) of the RF pulse at the first ADC; and wherein the one or more attributes of the second PDD comprise another TOA of the RF pulse at the second ADC.

Example 9. The system of any one of examples 1-8, wherein to corelate the first PDD of the first plurality of PDDs with the second PDD of the second plurality of PDDs, the correlator is configured to: determine a first observed frequency of the RF pulse at the first digital receiver, wherein the first PDD includes an indication of the first observed frequency; determine a second observed frequency of the RF pulse at the second digital receiver, wherein the second PDD includes an indication of the second observed frequency; determine a first plurality of possible alias frequencies of the RF pulse within corresponding different Nyquist zones of the first sampling frequency of the first ADC, based at least in part on the first observed frequency and the first sampling frequency; determine a second plurality of possible alias frequencies of the RF pulse within corresponding different Nyquist zones of the second sampling frequency of the second ADC, based at least in part on the second observed frequency and the second sampling frequency; and determine that the first PDD is a match with the second PDD, in response to a substantial match between one of the first plurality of possible alias frequencies with one of the second plurality of possible alias frequencies.

Example 10. The system of any one of examples 1-9, comprising: a frequency measurement module configured to receive the correlation signal, and measure a frequency of the RF pulse, based at least in part on the first PDD, the second PDD, the first sampling frequency, and the second sampling frequency.

Example 11. The system of example 10, wherein to measure the frequency of the RF pulse, the frequency measurement module is configured to: detect a Nyquist zone of the first sampling frequency that encompasses the frequency the RF pulse, based at least in part on (i) a first observed frequency of the RF pulse, as indicated by the first PDD, (ii) a second observed frequency of the RF pulse, as indicated by the second PDD, (iii) the first sampling frequency, and (iv) the second sampling frequency.

Example 12. The system of example 11, wherein to detect the Nyquist zone of the first sampling frequency that encompasses the frequency the RF pulse, the frequency measurement module is configured to: determine a ratio between (i) a difference in the first and second observed frequencies of the RF pulse, and (ii) a difference in the first and second sampling frequencies; and detect the Nyquist zone of the first sampling frequency, based on the ratio.

Example 13. The system of any one of examples 11-12, wherein to measure the frequency of the RF pulse, the frequency measurement module is configured to: measure the frequency of the RF pulse, based at least in part on (i) the first observed frequency of the RF pulse, as indicated by the first PDD, (ii) the first sampling frequency, and (iii) the detected Nyquist zone of the first sampling frequency that encompasses the frequency the RF pulse.

Example 14. An integrated circuit comprising the system of any one of examples 1-13.

Example 15. A method comprising: operating a first analog to digital converter (ADC), a second ADC, and a third ADC at a first sampling frequency, a second sampling frequency, and a third sampling frequency, respectively; sampling, by each of the first, second, and third ADCs, a plurality of radio frequency (RF) pulses, to respectively generate a first ADC output, a second ADC output, and a third ADC output; processing each of the first, second, and third ADC outputs, to respectively generate a first plurality of pulse description data signals (PDDs), a second plurality of PDDs, and a third plurality of PDDs, wherein each PDD of the first, second, and third plurality of PDDs is indicative of one or more attributes of a corresponding RF pulse of the plurality of RF pulses; comparing a first PDD of the first plurality of PDDs with each of two or more PDDs of the second plurality of PDDs and two or more PDDs of the third plurality of PDDs; correlating the first PDD and with a second PDD of the second plurality of PDDs, based at least in part on the comparing, wherein the first PDD and the second PDD are indicative of one or more attributes of a same RF pulse; and measuring a frequency of the RF pulse, based at least in part on the first PDD, the second PDD, the first sampling frequency, and the second sampling frequency.

Example 16. The method of example 15, wherein correlating the first PDD and with the second PDD comprises: determining a first match between the first PDD and the second PDD, and a second match between the first PDD and a third PDD of the third plurality of PDDs; and selecting, from the first and second matches, the first match between the first PDD and the second PDD, thereby correlating the first PDD with the second PDD.

Example 17. The method of example 16, wherein selecting, from the first and second matches, the first match between the first PDD and the second PDD comprises: determining that the first match is reciprocal match, and the second match is a non-reciprocal match; and selecting, from the first and second matches, the first match, based on the first match being a reciprocal match and the second match being a non-reciprocal match.

Example 18. The method of any one of examples 15-17, wherein comparing the first PDD with each of the two or more PDDs of the second plurality of PDDs and the two or more PDDs of the third plurality of PDDs comprises: comparing one or more attributes of the first PDD with corresponding one or more attributes of each of the two or more PDDs of the second plurality of PDDs and the two or more PDDs of the third plurality of PDDs, wherein the one or more attributes comprises one or more of (i) an amplitude of an RF pulse indicated by each PDD, (ii) a time of arrival (TOA) of an RF pulse to an ADC, as indicated by each PDD, and (iii) an observed frequency of an RF pulse, as indicated by each PDD.

Example 19. The method of any one of examples 15-18, wherein measuring the frequency of the RF pulse comprises: detecting a Nyquist zone of the first sampling frequency that encompasses the frequency the RF pulse, based at least in part on (i) a first observed frequency of the RF pulse, as indicated by the first PDD, (ii) a second observed frequency of the RF pulse, as indicated by the second PDD, (iii) the first sampling frequency, and (iv) the second sampling frequency; and measuring the frequency of the RF pulse, based at least in part on (i) the first observed frequency of the RF pulse, as indicated by the first PDD, (ii) the first sampling frequency, and (iii) the detected Nyquist zone of the first sampling frequency that encompasses the frequency the RF pulse.

Example 20. An apparatus comprising: a correlator configured to (i) receive a first plurality of pulse description data signals (PDDs) from a first digital receiver, and a second plurality of PDDs from a second digital receiver, and (ii) corelate a first PDD of the first plurality of PDDs with a second PDD of the second plurality of PDDs, wherein each of the first plurality of PDDs include corresponding one or more attributes of a corresponding RF pulse of a plurality of RF pulses sampled by a first analog to digital converter (ADC) at a first sampling frequency, and wherein each of the second plurality of PDDs include corresponding one or more attributes of a corresponding RF pulse of the plurality of RF pulses sampled by a second ADC at a second sampling frequency that is different from the first sampling frequency.

Example 21. The apparatus of example 20, comprising: a frequency measurement module configured to measure a frequency of a first RF pulse of the plurality of RF pulses, based at least in part on the first PDD, the second PDD, the first sampling frequency, and the second sampling frequency.

Example 22. The apparatus of any one of examples 20-21, wherein to corelate the first PDD with the second PDD, the correlator is configured to: determine that each of the first and second PDDs include corresponding one or more attributes of the same first RF pulse; and corelate the first PDD with the second PDD, based at least in part on the determination that each of the first and second PDDs include corresponding one or more attributes of the first RF pulse.

Example 23. The apparatus of any one of examples 20-22, wherein: the first PDD includes at least two or more of (i) an observed frequency of the first RF pulse at the first digital receiver, (ii) an observed amplitude of the first RF pulse at the first ADC and/or the first digital receiver, and (iii) a time of arrival (TOA) of the first RF pulse at the first ADC; and the second PDD includes at least two or more of (i) an observed frequency of the first RF pulse at the second digital receiver, (ii) an observed amplitude of the first RF pulse at the second ADC and/or the second digital receiver, and (iii) a TOA of the first RF pulse at the second ADC.

Example 24. The apparatus of any one of examples 20-24, wherein the apparatus is contained within one or more integrated circuit packages.

Numerous specific details have been set forth herein to provide a thorough understanding of the examples. It will be understood, however, that other examples may be practiced without these specific details, or otherwise with a different set of details. It will be further appreciated that the specific structural and functional details disclosed herein are representative of examples and are not necessarily intended to limit the scope of the present disclosure. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims. Furthermore, examples described herein may include other elements and components not specifically described, such as electrical connections, signal transmitters and receivers, processors, or other suitable components for operation of the antenna system 100.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and examples have been described herein. The features, aspects, and examples are susceptible to combination with one another as well as to variation and modification, as will be appreciated in light of this disclosure. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner and may generally include any set of one or more elements as variously disclosed or otherwise demonstrated herein.

What is claimed is:

1. A system comprising:

a first analog to digital converter (ADC) configured to operate at a first sampling frequency, and a second ADC configured to operate at a second sampling frequency different from the first sampling frequency, wherein each of the first and second ADCs are configured to receive a plurality of radio frequency (RF) pulses, and generate a first ADC output and a second ADC output, respectively;

a first digital receiver to process the first ADC output and generate a first plurality of pulse description data signals (PDDs), and a second digital receiver to process the second ADC output and generate a second plurality of PDDs, wherein each PDD of the first and second plurality of PDDs is indicative of attributes of a corresponding RF pulse of the plurality of RF pulses;

a correlator configured to corelate a first PDD of the first plurality of PDDs with a second PDD of the second plurality of PDDs, and generate a correlation signal indicative of the correlation of the first PDD with the second PDD, wherein each of the first PDD and the second PDD includes attributes of a same RF pulse of the plurality of RF pulses;

a third ADC configured to operate at a third sampling frequency different from each of the first and second sampling frequencies, wherein the third ADC is configured to receive the plurality of RF pulses, and generate a third ADC output; and a third digital receiver to process the third ADC output and generate a third plurality of PDDs;

wherein to corelate the first PDD of the first plurality of PDDs with the second PDD of the second plurality of PDDs, the correlator is configured to:

compare the first PDD with each of two or more PDDs of the second plurality of PDDs and two or more PDDs of the third plurality of PDDs, to determine a first match between the first PDD and the second PDD, and to further determine a second match between the first PDD and a third PDD of the third plurality of PDDs; and select, from the first and second matches, the first match between the first PDD and the second PDD, thereby correlating the first PDD with the second PDD.

2. The system of claim 1, wherein to select the first match from the first and second matches, the correlator is configured to:

determine that the first PDD matches with the second PDD, and the second PDD matches with the first PDD, to thereby determine that the first match between the first PDD and the second PDD is a reciprocal match;

determine that the first PDD matches with the third PDD, and the third PDD does not match with the first PDD, to thereby determine that the second match between the first PDD and the third PDD is a non-reciprocal match; and select, from the first and second matches, the first match, based on the first match being a reciprocal match and the second match being a non-reciprocal match.

3. The system of claim 1, wherein to select the first match from the first and second matches, the correlator is configured to:

determine that an attribute in the first and second PDDs differ by a first difference, and the attribute in the first and third PDDs differ by a second difference greater than the first difference, wherein the attribute is one of a corresponding RF pulse amplitude and a corresponding RF pulse time of arrival (TOA); and select, from the first and second matches, the first match, based on the second difference being greater than the first difference.

4. The system of claim 1, wherein to corelate the first PDD of the first plurality of PDDs with the second PDD of the second plurality of PDDs, the correlator is configured to:

compare, at a first comparator, one or more attributes of the first PDD with one or more attributes of the second PDD, to determine that the second PDD is a match with the first PDD;

compare, at a second comparator different from the first comparator, one or more attributes of the second PDD with one or more attributes of the first PDD, to determine that the first PDD is a match with the second PDD;

determine that the first PDD and the second PDD have reciprocal matching, based at least in part on (i) the second PDD being a match with the first PDD and (ii) the first PDD being a match with the second PDD; and corelate the first PDD with the second PDD, based at least in part on the first PDD and the second PDD having the reciprocal matching.

5. The system of claim 1, wherein to corelate the first PDD of the first plurality of PDDs with the second PDD of the second plurality of PDDs, the correlator is configured to:

compare one or more attributes of the first PDD with one or more attributes of the second PDD, to determine that the second PDD is a match with the first PDD;

wherein the one or more attributes of the first PDD comprise an amplitude of the RF pulse, as sampled by the first ADC and detected by the first digital receiver; and wherein the one or more attributes of the second PDD comprise an amplitude of the RF pulse, as sampled by the second ADC and detected by the second digital receiver.

6. The system of claim 1, wherein to corelate the first PDD of the first plurality of PDDs with the second PDD of the second plurality of PDDs, the correlator is configured to:

compare one or more attributes of the first PDD with one or more attributes of the second PDD, to determine that the second PDD is a match with the first PDD;

wherein the one or more attributes of the first PDD comprise a time of arrival (TOA) of the RF pulse at the first ADC; and wherein the one or more attributes of the second PDD comprise another TOA of the RF pulse at the second ADC.

7. The system of claim 1, wherein to corelate the first PDD of the first plurality of PDDs with the second PDD of the second plurality of PDDs, the correlator is configured to:

determine a first observed frequency of the RF pulse at the first digital receiver, wherein the first PDD includes an indication of the first observed frequency;

determine a second observed frequency of the RF pulse at the second digital receiver, wherein the second PDD includes an indication of the second observed frequency;

determine a first plurality of possible alias frequencies of the RF pulse within corresponding different Nyquist zones of the first sampling frequency of the first ADC, based at least in part on the first observed frequency and the first sampling frequency;

determine a second plurality of possible alias frequencies of the RF pulse within corresponding different Nyquist zones of the second sampling frequency of the second ADC, based at least in part on the second observed frequency and the second sampling frequency; and determine that the first PDD is a match with the second PDD, in response to a substantial match between one of the first plurality of possible alias frequencies with one of the second plurality of possible alias frequencies.

8. The system of claim 1, comprising:

a frequency measurement module configured to receive the correlation signal, and measure a frequency of the RF pulse, based at least in part on the first PDD, the second PDD, the first sampling frequency, and the second sampling frequency.

9. The system of claim 8, wherein to measure the frequency of the RF pulse, the frequency measurement module is configured to:

detect a Nyquist zone of the first sampling frequency that encompasses the frequency the RF pulse, based at least in part on (i) a first observed frequency of the RF pulse, as indicated by the first PDD, (ii) a second observed frequency of the RF pulse, as indicated by the second PDD, (iii) the first sampling frequency, and (iv) the second sampling frequency.

10. The system of claim 9, wherein to detect the Nyquist zone of the first sampling frequency that encompasses the frequency the RF pulse, the frequency measurement module is configured to:

determine a ratio between (i) a difference in the first and second observed frequencies of the RF pulse, and (ii) a difference in the first and second sampling frequencies; and detect the Nyquist zone of the first sampling frequency, based on the ratio.

11. The system of claim 9, wherein to measure the frequency of the RF pulse, the frequency measurement module is configured to:

measure the frequency of the RF pulse, based at least in part on (i) the first observed frequency of the RF pulse, as indicated by the first PDD, (ii) the first sampling frequency, and (iii) the detected Nyquist zone of the first sampling frequency that encompasses the frequency the RF pulse.

12. A method comprising:

operating a first analog to digital converter (ADC), a second ADC, and a third ADC at a first sampling frequency, a second sampling frequency, and a third sampling frequency, respectively;

sampling, by each of the first, second, and third ADCs, a plurality of radio frequency (RF) pulses, to respectively generate a first ADC output, a second ADC output, and a third ADC output;

processing each of the first, second, and third ADC outputs, to respectively generate a first plurality of pulse description data signals (PDDs), a second plurality of PDDs, and a third plurality of PDDs, wherein each PDD of the first, second, and third plurality of PDDs is indicative of one or more attributes of a corresponding RF pulse of the plurality of RF pulses;

comparing a first PDD of the first plurality of PDDs with each of two or more PDDs of the second plurality of PDDs and two or more PDDs of the third plurality of PDDs;

correlating the first PDD and with a second PDD of the second plurality of PDDs, based at least in part on the comparing, wherein the first PDD and the second PDD are indicative of one or more attributes of a same RF pulse; and measuring a frequency of the RF pulse, based at least in part on the first PDD, the second PDD, the first sampling frequency, and the second sampling frequency.

13. The method of claim 12, wherein correlating the first PDD and with the second PDD comprises:

determining a first match between the first PDD and the second PDD, and a second match between the first PDD and a third PDD of the third plurality of PDDs; and selecting, from the first and second matches, the first match between the first PDD and the second PDD, thereby correlating the first PDD with the second PDD.

14. The method of claim 12, wherein comparing the first PDD with each of the two or more PDDs of the second plurality of PDDs and the two or more PDDs of the third plurality of PDDs comprises:

comparing one or more attributes of the first PDD with corresponding one or more attributes of each of the two or more PDDs of the second plurality of PDDs and the two or more PDDs of the third plurality of PDDs, wherein the one or more attributes comprises one or more of (i) an amplitude of an RF pulse indicated by each PDD, (ii) a time of arrival (TOA) of an RF pulse to an ADC, as indicated by each PDD, and (iii) an observed frequency of an RF pulse, as indicated by each PDD.

15. The method of claim 12, wherein measuring the frequency of the RF pulse comprises:

detecting a Nyquist zone of the first sampling frequency that encompasses the frequency the RF pulse, based at least in part on (i) a first observed frequency of the RF pulse, as indicated by the first PDD, (ii) a second observed frequency of the RF pulse, as indicated by the second PDD, (iii) the first sampling frequency, and (iv) the second sampling frequency; and measuring the frequency of the RF pulse, based at least in part on (i) the first observed frequency of the RF pulse, as indicated by the first PDD, (ii) the first sampling frequency, and (iii) the detected Nyquist zone of the first sampling frequency that encompasses the frequency the RF pulse.

* * * * *